(12) United States Patent
Gotoh et al.

(10) Patent No.: US 7,553,754 B2
(45) Date of Patent: Jun. 30, 2009

(54) ELECTRONIC DEVICE, METHOD OF MANUFACTURE OF THE SAME, AND SPUTTERING TARGET

(75) Inventors: Hiroshi Gotoh, Kobe (JP); Toshihiro Kugimiya, Kobe (JP); Junichi Nakai, Kobe (JP); Katsufumi Tomihisa, Kobe (JP)

(73) Assignee: Kabushiki Kaisha Kobe Seiko Sho (Kobe Steel, Ltd.), Kobe-shi (JP)

( * ) Notice: Subject to any disclaimer, the term of this patent is extended or adjusted under 35 U.S.C. 154(b) by 175 days.

(21) Appl. No.: 11/471,595

(22) Filed: Jun. 21, 2006

(65) Prior Publication Data

US 2006/0237849 A1  Oct. 26, 2006

Related U.S. Application Data

(62) Division of application No. 10/737,121, filed on Dec. 17, 2003, now Pat. No. 7,098,539.

(30) Foreign Application Priority Data

Dec. 19, 2002  (JP) .............................. 2002-368786
Jul. 14, 2003  (JP) .............................. 2003-274288

(51) Int. Cl.
  *H01L 21/20* (2006.01)
(52) U.S. Cl. ........................ 438/620; 438/584; 438/610; 438/652; 438/687; 257/E21.174; 257/E21.582; 257/E23.072; 257/E23.159
(58) Field of Classification Search ................. 438/149, 438/584, 610, 620, 627, 652, 687; 257/E51.005, 257/E21.174, 582, E23.072, 139, 159
See application file for complete search history.

(56) References Cited

U.S. PATENT DOCUMENTS 3,716,469 A * 2/1973 Bhatt et al. ............. 204/192.25
5,514,909 A   5/1996 Yamamoto et al.
5,580,668 A * 12/1996 Kellam ....................... 428/610

(Continued)

FOREIGN PATENT DOCUMENTS

EP  0 573 002  12/1993

(Continued)

OTHER PUBLICATIONS

U.S. Appl. No. 11/743,916, filed May 3, 2007, Kawakami, et al.

(Continued)

*Primary Examiner*—Michael S Lebentritt
(74) *Attorney, Agent, or Firm*—Oblon, Spivak, McClelland, Maier & Neustadt, P.C.

(57) ABSTRACT

In an electronic device comprising a first electrodes consisting of a metal oxide and a second electrode consisting of an aluminum alloy film directly contacted and electrically connected to the first electrode, the contact interface between the aluminum alloy film and the first electrode is constructed so that at least a part of alloy components constituting the aluminum alloy film exist as a precipitate or concentrated layer. This construction enables direct contact between the aluminum alloy film and the electrode consisting of a metallic oxide and allows elimination of a barrier metal in such an electronic device, and manufacturing technology therefor.

7 Claims, 19 Drawing Sheets

U.S. PATENT DOCUMENTS

| | | | |
|---|---|---|---|
| 5,903,055 | A | 5/1999 | Takayama |
| 6,033,542 | A | 3/2000 | Yamamoto et al. |
| 6,046,115 | A * | 4/2000 | Molloy et al. ............... 438/710 |
| 6,096,438 | A | 8/2000 | Takagi et al. |
| 6,146,928 | A * | 11/2000 | Ishiguro et al. ............. 438/151 |
| 6,218,206 | B1 | 4/2001 | Inoue et al. |
| 6,252,247 | B1 | 6/2001 | Sakata et al. |
| 6,326,287 | B1 * | 12/2001 | Asahina et al. ............. 438/584 |
| 6,329,275 | B1 | 12/2001 | Ishigami et al. |
| 6,791,188 | B2 * | 9/2004 | Hagihara et al. ............ 257/771 |
| 2003/0047812 | A1 | 3/2003 | Hagihara et al. |
| 2005/0184395 | A1 | 8/2005 | Gotoh et al. |
| 2006/0237849 | A1 | 10/2006 | Gotoh et al. |
| 2008/0081532 | A1 | 4/2008 | Okuno |
| 2008/0121522 | A1 | 5/2008 | Ehira et al. |
| 2008/0223718 | A1 | 9/2008 | Takagi et al. |

FOREIGN PATENT DOCUMENTS

| | | |
|---|---|---|
| EP | 0 855 451 | 7/1998 |
| JP | 7-45555 | 2/1995 |
| JP | 8-250494 | 9/1996 |
| JP | 11-3873 | 1/1999 |
| JP | 11-283934 | 10/1999 |
| JP | 11-337976 | 12/1999 |
| JP | 2000-199054 | 7/2000 |
| JP | 2001-345445 | 12/2001 |
| JP | 2002-296804 | 10/2002 |
| JP | 2003-89864 | 3/2003 |
| KR | 1999-0064231 | 7/1999 |

OTHER PUBLICATIONS

Patent Abstracts of Japan, JP 4-116829, Apr. 17, 1992.
U.S. Appl. No. 11/471,595, filed Jun. 21, 2006, Gotoh et al.
U.S. Appl. No. 11/461,907, filed Aug. 2, 2006, Kawakami, et al.
U.S. Appl. No. 11/471,595, filed Jun. 21, 2006, Gotoh, et al.
U.S. Appl. No. 11/461,927, filed Aug. 2, 2006, Kugimiya, et al.
U.S. Appl. No. 12/126,527, filed May 23, 2008, Hino, et al.
U.S. Appl. No. 12/131,444, filed Jun. 2, 2008, Gotoh.
U.S. Appl. No. 12/131,493, filed Jun. 2, 2008, Gotoh, et al.
U.S. Appl. No. 12/136,409, filed Jun. 10, 2008, Ochi, et al.
U.S. Appl. No. 12/172,442, filed Jul. 14, 2008, Takagi, et al.

* cited by examiner

TEG PATTERN

ELECTRONIC DEVICE, METHOD OF MANUFACTURE OF THE SAME, AND SPUTTERING TARGET

BACKGROUND OF THE INVENTION

1. Field of the Invention

This invention relates to an electronic device in a thin film form, the method of its manufacture, and a sputtering target. Specifically the invention relates to a novel display device comprising, as its constituents, pixel electrodes used in active and passive matrix type flat panel displays such as semiconductor displays and liquid crystal displays, reflective films, optical components etc., and aluminum alloy film; the method of its manufacture; and the sputtering target.

2. Description of the Related Art

For example, the active matrix type liquid crystal display uses thin film transistors (TFT) as switching elements, and is composed of a TFT array substrate equipped with a wiring section of pixel electrodes, scan lines, signal conductors, etc., an opposed substrate equipped with a common electrode that is disposed in opposition to the TFT array substrate with a predetermined spacing, and a liquid crystal layer that is filled between the TFT array substrate and the opposed substrate. For the pixel electrodes, an indium tin oxide (ITO) film with about 10 wt % tin oxide (SnO) contained in indium oxide ($In_2O_3$) and the like is used.

Moreover, regarding the signal conductors of the wiring section that are connected to these pixel electrode electrically, in order that pure aluminum or an aluminum alloy, such as Al—Nd, shall not come in direct contact with the pixel electrodes, a multilayer film made of a high melting point metal, such as Mo, Cr, Ti, and W, is made to exist between them as a barrier metal. However, recently, trials where these high melting point metals are eliminated and the pixel electrode is brought into direct connection with the signal conductor are being advanced.

For example, according to JP-A No. 337976/1999, it is described that if a pixel electrode made of an ITO film with about 10 wt % zinc oxide contained in indium oxide is used, direct contact with signal conductors becomes possible.

Moreover, U.S. Pat. No. 6,218,206 discloses a method of performing surface treatment on a drain electrode by plasma processing or ion implantation, and U.S. Pat. No. 6,252,247 discloses a method of forming a multilayer film by depositing a second phase containing impurities, such as N, O, Si, and C, on a first layer of gate, source, and drain electrodes on the first layer of gate, source, and drain electrodes. It was made clear that adoption of these methods makes it possible to maintain contact resistance with the pixel electrode to a low level even if the high melting point metal is eliminated.

The reason for disposing a barrier metal in-between in the conventional technology is that, if aluminum or aluminum alloy wiring that constitutes signal conductors is brought into direct contact with the pixel electrode, the contact resistance will increase and display quality of a screen will deteriorate. This is because aluminum is very easy to oxidize and the surface thereof is easily oxidized in the air and because the pixel electrode is a metal oxide and hence aluminum is oxidized by oxygen generated at the time of film deposition and oxygen added at the time of film deposition to form an aluminum oxide layer on the surface thereof. Then, if an insulating material layer is formed in the contact interface between the signal conductors and the pixel electrode in this way, the contact resistance between the signal conductors and the pixel electrode will increase and the display quality of a screen will deteriorate.

On the other hand, although the barrier metal has originally an action of preventing surface oxidization of the aluminum alloy and improving contact between the aluminum alloy film and the pixel electrode, a barrier metal forming process becomes indispensable to obtain the conventional structure wiring such that a barrier metal is disposed between the contact interface; therefore, a deposition chamber for forming a barrier metal must be provided redundantly in addition to a depositing sputtering apparatus required for the formation of the gate electrode, the source electrode, and the drain electrode. However, as the cost of a liquid crystal panel etc. keeps to be reduced by mass production, it has become difficult to neglect the increase in the manufacturing cost and the decrease in productivity accompanying the formation of a barrier metal.

Due to such circumstances, an electrode material and a manufacturing process that enables dispensing of the barrier metals are desired recently. In response to such a demand, U.S. Pat. No. 6,218,206 supplemented one process for performing surface treatment. On the other hand, according to U.S. Pat. No. 6,252,247, deposition of the gate electrode, the source electrode, or the drain electrode can be performed continuously in the same deposition chamber, but increase in the number of steps cannot be avoided. Besides, when the chamber is used continuously, there occurs frequently a phenomenon that films peel off the wall of the chamber due to a difference of thermal expansion coefficient between a film into which impurities have been mixed and a film into which no impurity has been mixed, and consequently the equipment must be halted frequently because of maintenance. Moreover, according to the patent document 1, indium tin oxide (ITO) that is most popular at present must be altered to indium zinc oxide (IZO), which increases material cost.

In order to maintain the display quality of a display device, the electrode material is required to provide low electric resistance and a high level of heat resistance. For example, the properties required to be used as a source and drain electrode material of the amorphous TFT (one of elements of display devices) etc. are an electrical resistivity of 8 $\mu\Omega\cdot$cm or less (preferably, 5 $\mu\Omega\cdot$cm or less) and a heatproof temperature of 300 to 350° C. The properties required to be used as a gate electrode material are an electrical resistivity of 8 $\mu\Omega\cdot$cm or less and a heatproof temperature of 400 to 450° C. Since a current is made to flow always in the source/drain electrodes in order to read a pixel, it is desirable to suppress the electrical resistivity low and hence lessen power consumption of the display device. Moreover, it is necessary to lessen the time constant that is determined as a product of resistance and regulation capacity, so that display quality can be maintained even when the display panel is enlarged. Furthermore, the required heat resistance varies with the structure of a display device, and depends on deposition temperature of an insulating film that is used in post processing after electrode formation, and deposition temperature and heat treatment temperature of semiconductor layers.

SUMMARY OF THE INVENTION

This invention is devised paying attention to the situation as described above. It is the object thereof to establish a technology that enable elimination of a barrier metal as described above and simplification of the process without increasing the number of steps, and can make an aluminum alloy film contact with the electrode directly and surely. Another object is to make excellent electric properties capable of realizing low electrical resistivity and low contact resistance compatible with heat resistance, and to establish a technology that enables commonality of material between the reflective electrode and a TAB connection electrode in the display device.

A construction of the electronic device according to this invention that was able to solve the problems has points as follows: the electronic device comprises a first electrodes consisting of a metal oxide and a second electrode consisting of an aluminum alloy film which is directly contacted and electrically connected to the first electrode, wherein, in the contact interface between the aluminum alloy film and the first electrode, at least a part of alloy components constituting the aluminum alloy film exist as a precipitate or a concentrated layer.

Preferably, the aluminum alloy film contains, as its alloy component, at least one element selected from the group consisting of Au, Ag, Zn, Cu, Ni, Sr, Sm, Ge, and Bi in the range of 0.1 to 6 at %. Among them, one that contains at least Ni is preferable.

As the first electrode used as a constituent of this invention, indium tin oxide and indium zinc oxide are suitable.

The aluminum alloy film may contain, as its another alloy component, at least one element selected from the group consisting of Nd, Y, Fe, and Co in the range of 0.1 to 6 at %.

Among the aluminum alloy films, the most preferable is one that contains at least $X_1$ element ($X_1$=at least one element of Ag, Zn, Cu, and Ni) and $X_2$ element ($X_2$=at least one element of Nd and Y) as the alloy components, and their contents satisfy the following formula (I):

$$0.2 \leq 0.5 \times CX_1 + CX_2 \leq 4.5 \quad \text{(I)}$$

[$CX_1$ represents the content of Ag, Zn, Cu, and Ni in the aluminum alloy (at %), and $CX_2$ represents the content of Nd and Y in the aluminum alloy (at %)], or contains at least Y1 element ($Y_1$=at least one element of Ag, Zn, Cu, and Ni) and $Y_2$ element ($Y_2$=at least one element of Fe and Co), and their contents satisfy the following formula (II):

$$0.4 \leq CY_1 + CY_2 \leq 6 \quad \text{(II)}$$

[$CY_1$ represents the content of Ag, Zn, Cu, and Ni in the aluminum alloy (at %), and $CY_2$ represents the content of Fe and Co (at %) in the aluminum alloy].

It is preferable that the aluminum alloy film is so formed that a part or all of alloy components forming a solid solution in a non-equilibrium state becomes a precipitate or a concentrated layer and that the electrical resistivity of the aluminum alloy film is suppressed to 8 μΩ·cm or less. In addition, it is preferable that a precipitate exists in the contact interface between the aluminum alloy film and the first electrode so that the number of the precipitate particles having sizes of more than 0.01 μm in major diameter exceeds 0.13 particle/100 μm² or the area factor thereof exceeds 0.5%.

It is desirable that the aluminum alloy film containing Ni as its alloy component has a Ni-concentrated layer whose Ni content in a thickness region of 1 to 10 nm from the surface of the film is 10 at % or less. The Ni-concentrated layer here means a layer whose Ni content is more than that in the inner portion of the aluminum alloy film. Then these aluminum alloy films function effectively as a reflective film or a TAB connection electrode in display devices.

The method of manufacture according to this invention is ranked as a useful method for manufacturing the electronic device, and the method comprises the step of forming a precipitate that contains at least a part of the alloy components contained in the aluminum alloy film by heating the aluminum alloy film formed on a substrate at a temperature of 150 to 400° C.

In putting this method in practice, a precipitate (an intermetallic compound) can be formed in the contact interface between the aluminum alloy film and the first electrode by making a part or all of the alloy components forming a solid solution in a non-equilibrium state as the aluminum alloy film and alloy components of the first electrode diffuse mutually. Moreover, as a preferable method of forming the aluminum alloy film, the sputtering method is exemplified. Furthermore, it is preferable that an insulating film is formed on the aluminum alloy film to make a lamination, contact hole etching is performed on the insulating film, and successively after this the aluminum alloy wiring is subjected to light etching by 1 to 200 nm, more preferably 3 to 100 nm, from the aluminum alloy surface, and thereby a precipitate (intermetallic compound) of a part or all of alloy components forming a solid solution in a non-equilibrium state is exposed partly. This is because contact resistance between itself and the first electrode formed thereon can be further reduced.

The light etching can be performed by dry etching using a gas capable of etching the aluminum alloy film or by wet etching using a chemical capable of etching the aluminum alloy film, and it is recommended that for the chemical used in the light etching, a stripper for a photoresist used in patterning is used.

The sputtering target of this invention is a useful target material for forming aluminum alloy films as described above, and is characterized in that it contains, as its alloy component, at least one element selected from the group consisting of Ag, Zn, Cu, and Ni in the range of 0.1 to 6 at %, and that it contains, as its alloy component, at least one element selected from the group consisting of Nd, Y, Fe, and Co in the range of 0.1 to 6 at %.

The invention constructed as described above makes it possible to directly contact between the aluminum alloy film and the electrode, alleviate the manufacturing man-hour and cost by eliminating the barrier metal. And thereby the invention can provide the electronic device and the array substrate having the properties of low-cost and high-performance.

According to the present invention, any one of noble metals hard to oxidize, such as Au and Ag, or elements each of whose oxide has a comparatively low electrical conductivity, such as Zn, Co, Ni, Sr, Ge, and Sm, or an element that has a low solid solubility limit in aluminum, such as Bi, in trace amounts is made to be contained in an aluminum alloy film. And an area having a low electric resistance is formed partly or all-over in the contact interface between the first electrode and the second electrode (aluminum alloy film) without deteriorating electrical conductivity of the film itself as a wiring material. Consequently the contact resistance between the first electrode and the second electrode (aluminum alloy film) is reduced considerably, making possible to reduce the number of steps and manufacturing cost considerably. Furthermore, when this invention is applied to the liquid crystal display, the display quality thereof can be maintained at a high level. Furthermore, heat resistance can be increased considerably by adding at least one element selected from Nd, Y, Fe, and Co.

DESCRIPTION OF THE PREFERRED EMBODIMENTS

Figure 1:
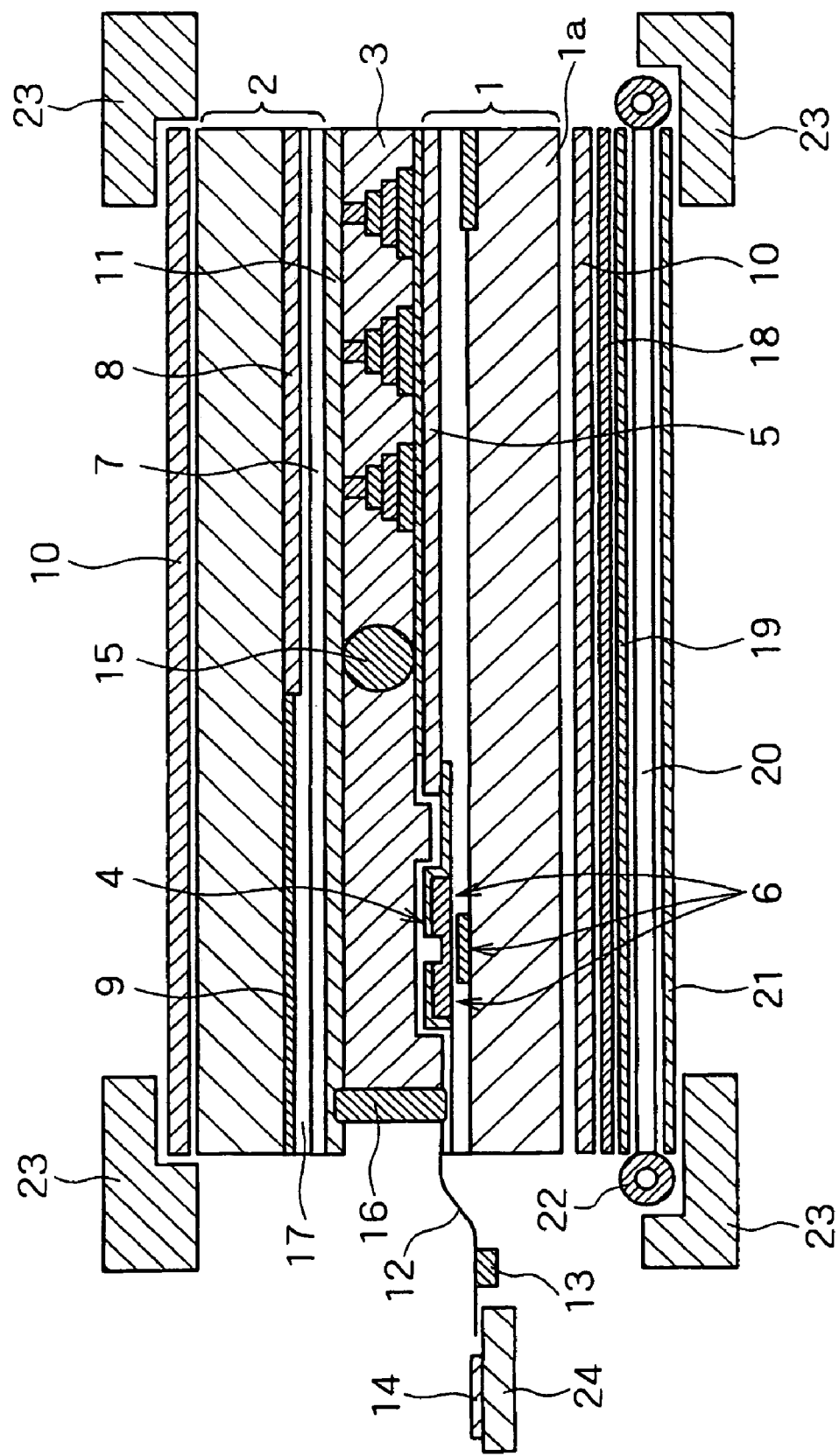
FIG. 1 is a schematic sectional enlarged explanatory diagram illustrating constructions of the liquid crystal panel substrate to which the array substrate for display devices of this invention is applied and of the liquid crystal display device.

Referring to the drawings, embodiments of the display device and array substrate for display device as a kind of an electronic device according to this invention will be described in detail. This invention is not necessarily limited to examples of illustration, but can be put to practice by appropriately adding alterations thereto in a range that can be in conformity to the later-described scopes. All such altered examples are included in the technical scope of this invention.

Although the aluminum alloy films are applicable similarly to passive matrix drive type display devices not containing TFT, reflective electrodes of reflective liquid crystal display devices, and TAB connection electrodes used for signal input and output to the outside, the embodiments relating to those will be omitted.

FIG. 1 is a schematic sectional enlarged explanatory drawing of a liquid crystal panel that is installed in the liquid crystal display to which this invention is applied.

A liquid crystal panel of FIG. 1 is provided with a TFT array substrate 1, an opposed substrate 2 disposed in opposition to the TFT array substrate 1, and a liquid crystal layer 3 disposed between the TFT array substrate 1 and the opposed substrate 2 and functioning as a light modulation layer. The TFT array substrate 1 consists of an insulating glass substrate 1a, thin film transistors (TFT) 4 arranged on the insulating glass substrate 1a, pixel electrodes 5, and a wiring section 6 including scan lines and signal conductors.

The opposed substrate 2 consists of a common electrode 7 formed on the whole surface of the TFT array substrate 1, a color filter 8 arranged at positions in opposition to the pixel electrodes 5, and a light shielding film 9 arranged at positions in opposition to the thin film transistors (TFT) 4 and the wiring section 6 on the TFT array substrate 1.

Polarizing plates 10, 10 are arranged on the outer sides of the insulating substrates constituting the TFT array substrate 1 and the opposed substrate 2, and an oriented film 11 for making liquid crystal molecules contained in the liquid crystal layer 3 oriented in a predetermined direction is provided on the opposed substrate 2.

In the liquid crystal panel with such a structure, the orientation direction of the liquid crystal molecules in the liquid crystal layer 3 is controlled by an electric field formed between the opposed substrate 2 and the pixel electrodes 5, and light passing through the liquid crystal layer 3 between the TFT array substrate 1 and the opposed substrate 2 is modulated, whereby the amount of light passing through the opposed substrate 2 is controlled to display images.

The TFT array is driven by a driver circuit 13 and a control circuit 14 by means of a TAB tape 12 drawn to the outside of the TFT array.

In FIG. 1, numeral 15 stands for a spacer, 16 for a shielding member, 17 for a protection film, 18 for a diffusive plate, 19 for a prism sheet, 20 for a light guiding plate, 21 for a reflecting plate, 22 for a backlight, 23 for a retaining frame, and 24 for a printed circuit board. These will be explained later.

Figure 2:
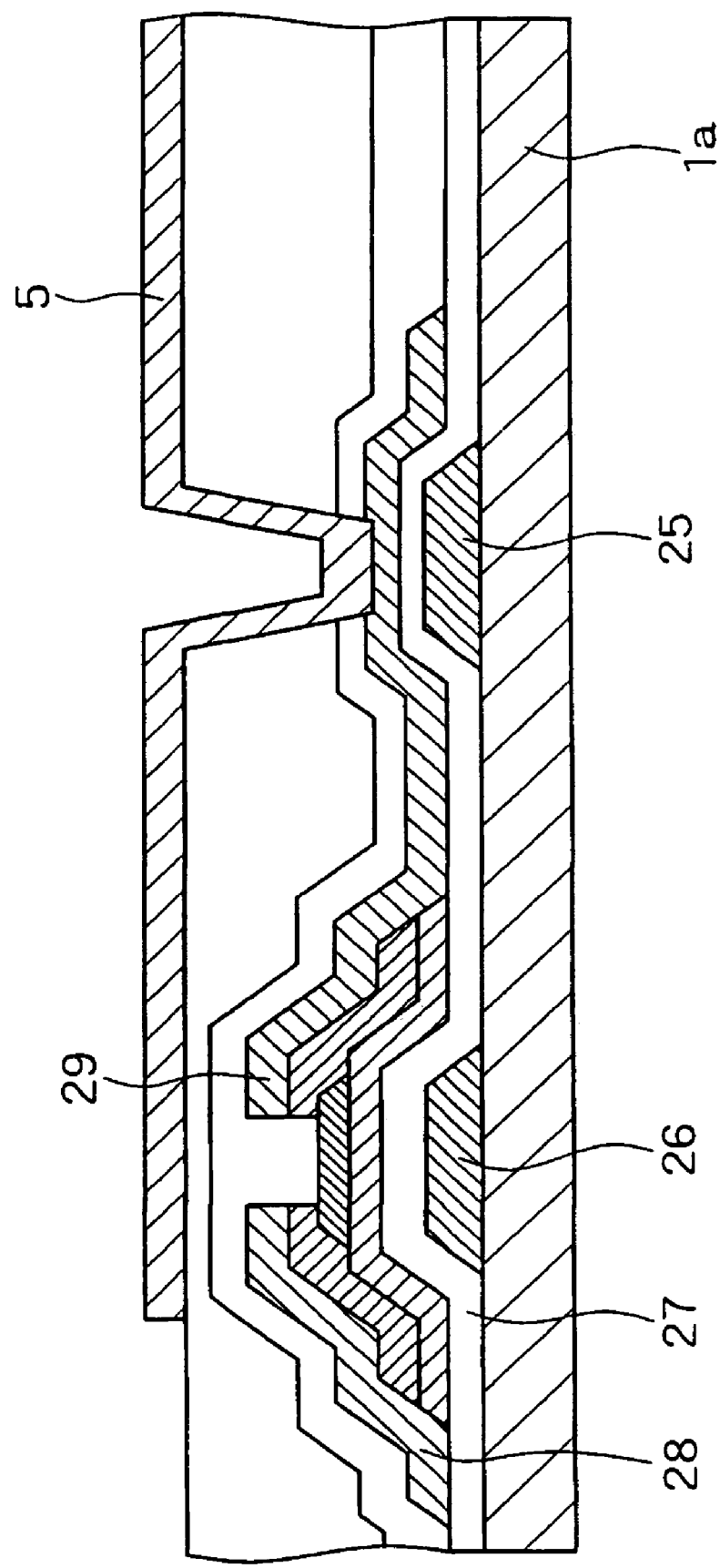
FIG. 2 is a schematic sectional explanatory diagram illustrating the structure of the thin film transistor applied to the array substrate for display devices according to the first embodiment of this invention.

FIG. 2 is a schematic sectional explanatory diagram that exemplifies a structure of a thin film transistor part according to the first embodiment applied to the array substrate adopted by this invention. As shown in FIG. 2, a scan line 25 is formed using aluminum alloy on the glass substrate 1a, and a part of the scan line functions as a gate electrode 26 for controlling turning on and off of the thin film transistor. Moreover, a signal conductor is formed of an aluminum alloy so as to intersect the scan line 25 through the medium of a gate insulating film 27, and a part of the signal conductor functions as a source electrode 28 of the thin film transistor.

A pixel electrode 5 formed of, for example, an ITO film with SnO contained in $In_2O_3$ is arranged on a pixel region built on the gate insulating film 27. A drain electrode 29 of the thin film transistor formed of the aluminum alloy directly contacts the pixel electrode 5, establishing electric connection.

In this TFT array substrate 1, if a gate voltage is supplied to the gate electrode 26 through the scan line 25, the thin film transistor is switched on, and a drive voltage supplied in advance on the signal conductor is supplied from the source electrode 28 to the pixel electrode 5 through the drain electrode 29. Then, if the drive voltage at a predetermined level is supplied to the pixel electrode 5, an electric potential difference is generated between itself and an opposed substrate 2, as explained in FIG. 1, making liquid crystal molecules which are contained in the liquid crystal layer 3 oriented thereby to perform light modulation.

Next, the method of manufacture of the TFT array substrate 1 shown in FIG. 2 will be described briefly. Incidentally, for the thin film transistor formed as a switching element, an amorphous silicon thin film transistor that uses hydrogenated amorphous silicon as a semiconductor layer is given here as an example.

The outline of the manufacturing process of the TFT array substrate 1 according to the first embodiment will be explained taking FIG. 3 through FIG. 10 for example.

Figure 3:
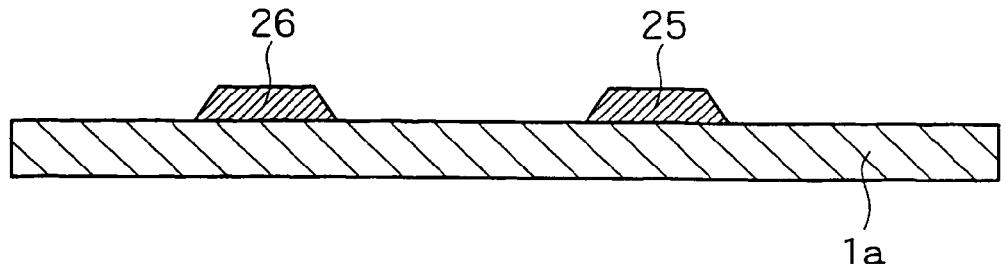
FIG. 3 is an explanatory diagram showing one example of the manufacturing process of the array substrate for display devices shown in the FIG. 2 in order.
Figure 4:
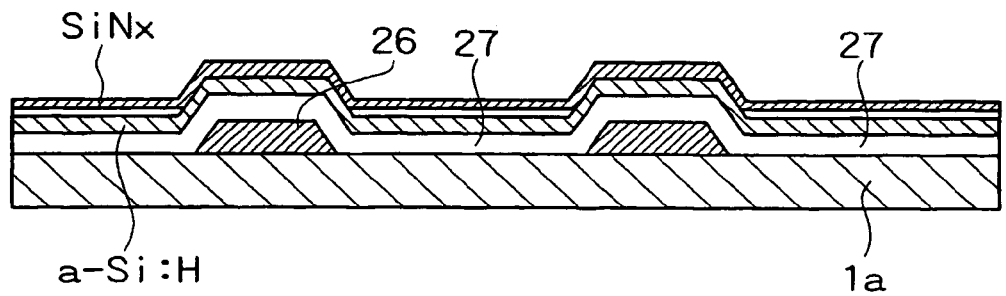
FIG. 4 is an explanatory diagram showing one example of the manufacturing process of the array substrate for display devices shown in the FIG. 2 in order.

First, an aluminum alloy thin film with a thickness of about 200 nm is deposited on the glass substrate 1a using a technique of sputtering etc., and the aluminum alloy thin film is patterned, whereby the gate electrode 26 and the scan line 25 are formed (FIG. 3). It is recommended that at this time, the periphery of the aluminum alloy thin film be etched to a taper shape of an angle of approximately 30 to 40 degrees so that coverage of the gate insulating film 27 (described later) becomes excellent. Next, as shown in FIG. 4, the gate insulating film 27 is formed with silicon oxide ($SiO_x$) with a thickness of, for example, approximately 300 nm by the technique of, for example, plasma CVD method, and a hydrogenated amorphous silicon film (a-Si:H) with a thickness of, for example, about 50 nm and a silicon nitride film ($SiN_x$) with a thickness of about 300 nm are deposited.

Figure 5:
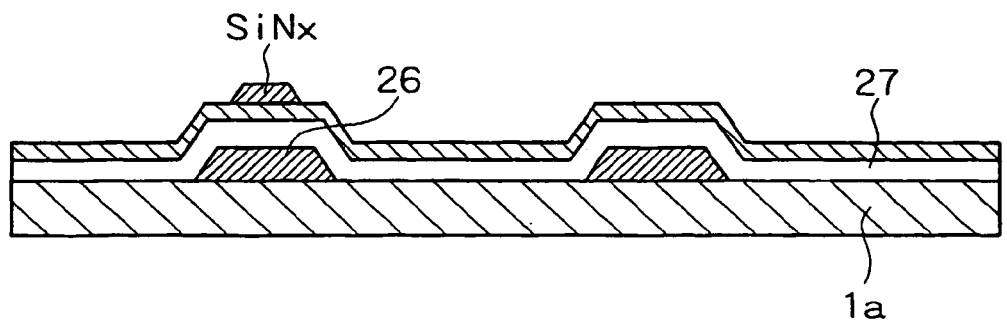
FIG. 5 is an explanatory diagram showing one example of the manufacturing process of the array substrate for display devices shown in the FIG. 2 in order.
Figure 6:
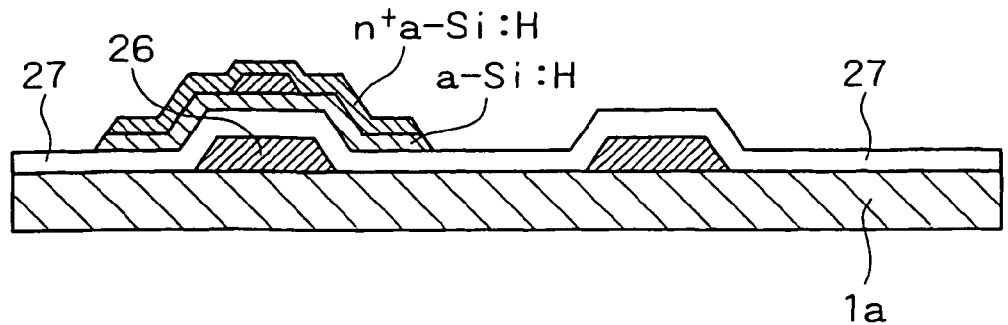
FIG. 6 is an explanatory diagram showing one example of the manufacturing process of the array substrate for display devices shown in the FIG. 2 in order.

Subsequently, the silicon nitride film ($SiN_x$) is patterned by back exposure using the gate electrode 26 as a mask, as shown in FIG. 5, to form a channel protection film. Moreover, $n^+$ type hydrogenated amorphous silicon film ($n^+$a-Si:H) to which phosphor is doped with a thickness of, for example, about 50 nm is deposited thereon, and the hydrogenated amorphous silicon film (a-Si:H) and the $n^+$ type hydrogenated amorphous silicon film ($n^+$a-Si:H) are patterned, as shown in FIG. 6.

Figure 7:
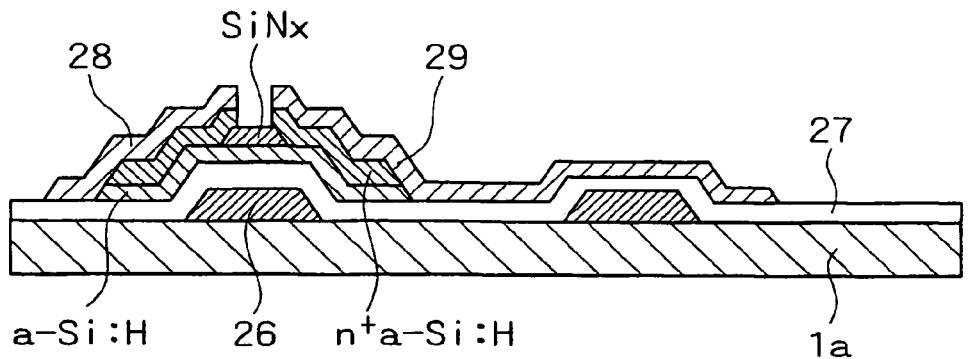
FIG. 7 is an explanatory diagram showing one example of the manufacturing process of the array substrate for display devices shown in the FIG. 2 in order.

Furthermore, on the patterned two films, the aluminum alloy film with a thickness of, for example, about 300 nm is deposited, and is patterned as shown in FIG. 7, whereby the source electrode 28 integral with the signal conductor and the drain electrode 29 contacted with the pixel electrode 5 are formed. Still furthermore, $n^+$ type hydrogenated amorphous silicon film (n⁺a-Si:H) on the channel protection film ($SiN_x$) is removed by using the source electrode 28 and the drain electrode 29 as a mask.

Figure 8:
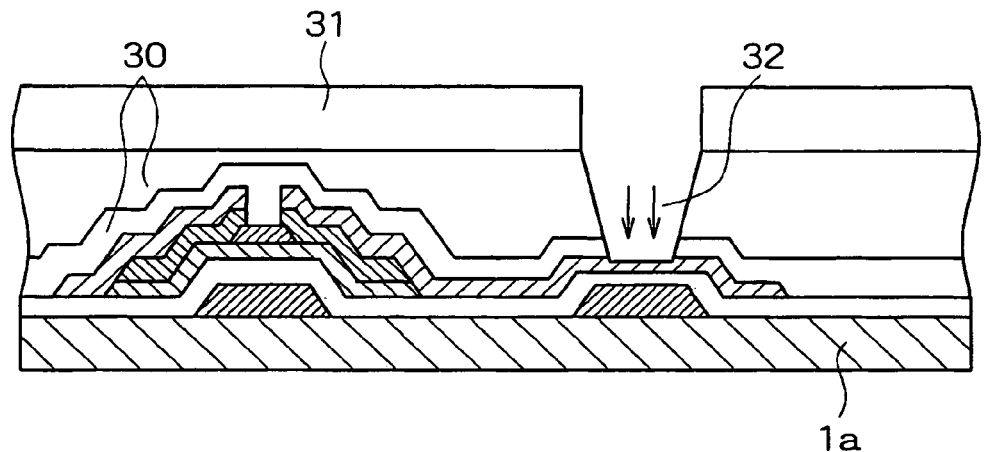
FIG. 8 is an explanatory diagram showing one example of the manufacturing process of the array substrate for display devices shown in the FIG. 2 in order.

Then, as shown in FIG. 8, a layer insulation film is formed by depositing a silicon nitride film 30 to a thickness of, for example, about 300 nm using a plasma CVD apparatus etc. Deposition at this time is performed at, for example, about 300° C. In addition, a photoresist layer 31 is formed on this silicon nitride film 30, subsequently the silicon nitride film 30 is patterned, and a contact hole 32 is formed in the silicon nitride film 30 by, for example, dry etching etc. In this occasion, even after the completion of etching of the silicon nitride film 30, over-etching is further applied for a period of a time necessary to etch silicon nitride plus 10% or so. By this treatment, the aluminum alloy surface is also etched by about a few tens of nm.

Figure 9:
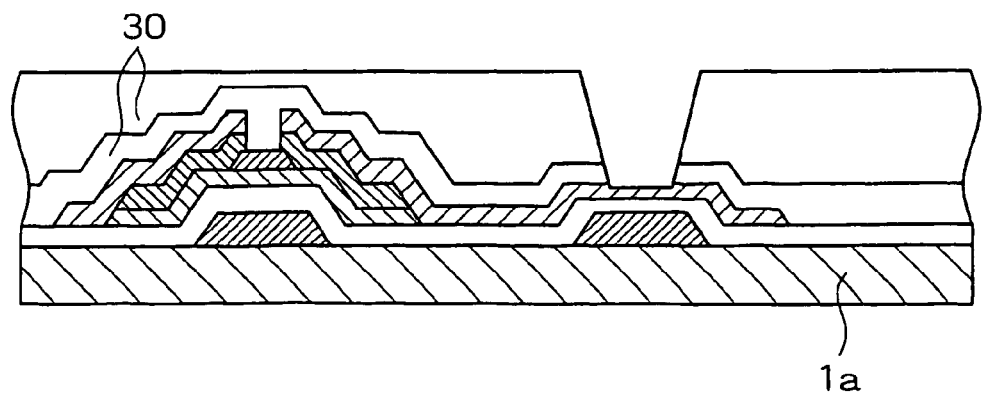
FIG. 9 is an explanatory diagram showing one example of the manufacturing process of the array substrate for display devices shown in the FIG. 2 in order.
Figure 10:
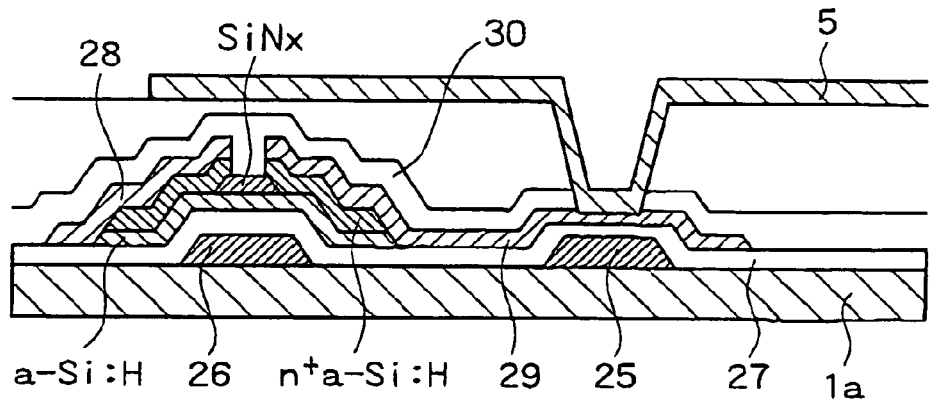
FIG. 10 is an explanatory diagram showing one example of the manufacturing process of the array substrate for display devices shown in the FIG. 2 in order.

Furthermore, as shown in FIG. 9, after being subjected to an ashing process using, for example, oxygen plasma, the substrate is subjected to stripping of the photoresist layer 31 using, for example, a stripper of the amine system etc., and finally the ITO film with a thickness of, for example, about 40 nm is deposited and the pixel electrode is formed by patterning, as shown in FIG. 10, whereby the TFT array substrate is completed.

The TFT array substrate formed by such a manufacturing process becomes one such that the pixel electrode 5 and the drain electrode 29 formed by the aluminum alloy are contacted each other directly. The aluminum alloy used in this invention can be used also as reflective electrodes and TAB connection electrodes of reflective liquid crystal displays.

Figure 11:
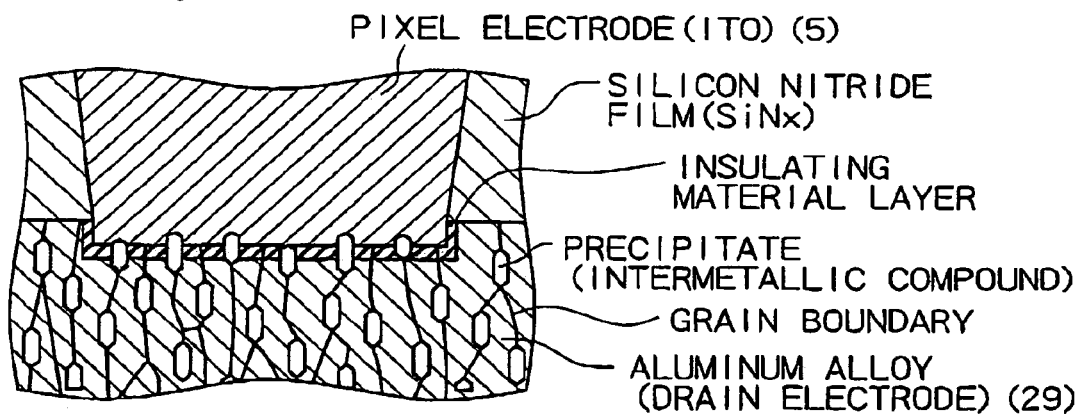
FIG. 11 is a sectional schematic diagram illustrating the structure of the contact interface between the aluminum alloy film and the pixel electrode in the array substrate for display devices obtained in the embodiment of this invention.
Figure 12:
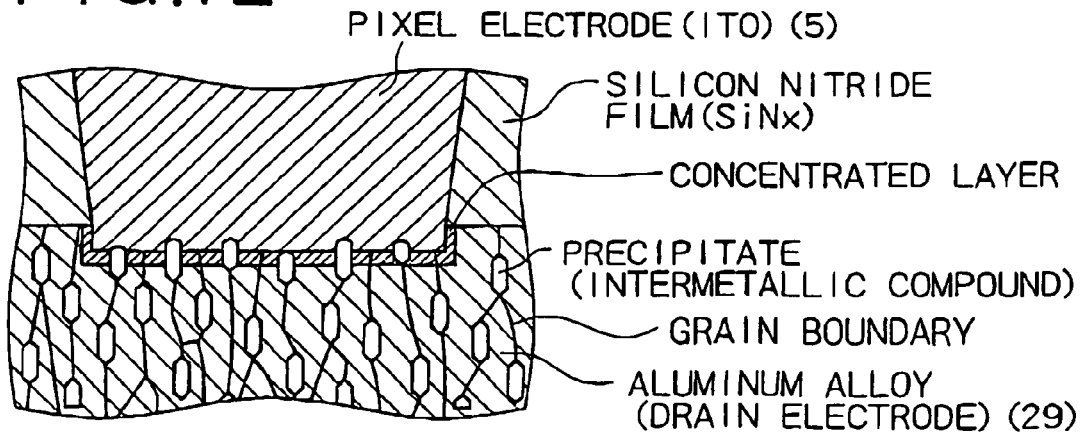
FIG. 12 is a conceptual diagram illustrating a contact hole such that a precipitate compound is formed and a Ni-concentrated layer is formed in the interface.
Figure 13:
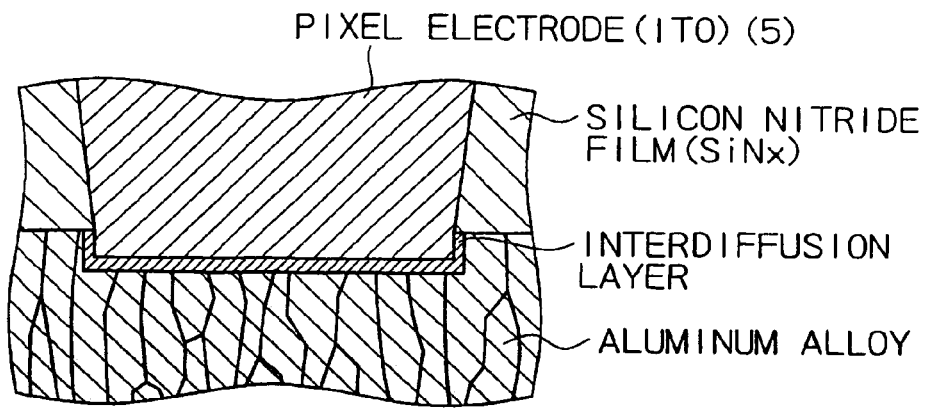
FIG. 13 is a sectional schematic diagram illustrating further another structure of the contact interface between the aluminum alloy wiring and the pixel electrode in the array substrate for display devices obtained in the embodiment of this invention.

When the method of manufacture is put to practice, if an aluminum alloy that contains at least one element selected from the group consisting of Au, Ag, Zn, Cu, Ni, Sr, Sm, Ge, and Bi as its alloy component in the range of 0.1 to 6 at % is used as the aluminum alloy film material constituting the drain electrode 29, three kinds of interfaces as shown in, for example, sectional enlarged conceptual diagram of FIG. 11 through FIG. 13 are formed in the contact interface between the aluminum alloy film constituting the drain electrode 29 and the pixel electrode 5 according to formation conditions of the drain electrode 29.

An aluminum alloy film containing the alloy components in the above mentioned content can be formed using a sputtering target consisting of an aluminum alloy containing the alloy components in the content. The sputtering target may further contain at least one element selected from the group consisting of Nd, Y, Fe, and Co in the range of 0.1 to 6 at %.

Incidentally, in the case where the amount of the alloy component contained in the aluminum alloy film is less than 0.1 at %, the amount of the concentrated layer and the precipitate (the intermetallic compound) formed in the contact interface between itself and the pixel electrode is insufficient, and hence contact resistance reduction effect at a level that this invention intends becomes difficult to attain; conversely, in the case where the aluminum alloy film is made to contain over 6 at % alloy component excessively, the electric resistance of the aluminum alloy film becomes high, the response speed of the pixel becomes slow, power consumption increases, and the quality as a display falls, and hence it becomes impossible to put to practical use. Therefore, in consideration of these advantages and disadvantages, it is desired to control the content of the alloy component to be not less than 0.1 at %, more preferably not less than 0.2 at %, and not more than 6 at %, even more preferably not more than 5 at %.

FIG. 11 is a diagram showing schematically a state where a conductive precipitate containing the alloy component (solute element) is formed in the contact interface between the aluminum alloy film and the pixel electrode 5, and the aluminum alloy and the pixel electrode are kept in electrical conduction by allowing a large portion of a contact current to flow through this precipitate. Such a state can be realized by forming a conductive precipitate including the solute element in an aluminum grain boundary through, for example, application of a heat hysteresis as described below at the time of insulating film formation or a heat treatment after the wiring film formation and before contact etching a technique as described below.

That is, the aluminum film is subjected to a heat hysteresis at the time of depositing the insulating film or a heat treatment, preferably at a temperature of 150 to 400° C. for 15 minutes, after the formation of the wiring film and before the contact hole etching, and thereby is made to recrystalize, so that a precipitate containing the solute element or an intermetallic compound of the solute element including aluminum is made to form in the aluminum grain boundary.

Next, in the contact hole etching process of the insulating film, the aluminum alloy surface is treated by light etching for an added over-etching time so that aluminum alloy surface is etched by 1 to 200 nm from the aluminum alloy surface, more preferably by about 3 to 100 nm. For the same effect, it is possible to expose a part of a precipitate (intermetallic compound) of a solute element on the aluminum alloy surface by using a stripper of the amine system cleaning the aluminum surface and having a light etching effect on aluminum in a photoresist stripping process after the contact hole etching process of the insulating film. At this time, even if the insulating film is formed on the aluminum alloy surface, it is hard for an oxide film to be formed on the exposed part as compared to aluminum due to a characteristic of the solute element, and hence the insulating film is hardly formed; and a conductive oxide may be formed depending on an element. Besides, since this exposed part has a low electric resistance, a current is easy to flow therein, and even if the aluminum alloy film is directly connected with the pixel electrode 5, the contact resistance can be held down.

Note that a kind of stripper used in this process is not specially limited, preferably, it contains about 5 to 70 wt % monoethanolamine, more preferably about 25 to 70 wt % monoethanolamine, as a principal component. This stripper is a stripper that is in general use in order to remove a deteriorated film and a polymer coating film that remains after etching of metal materials of various kinds, and also has a high effect of removing contamination. Therefore, by using such a stripper for washing, it is possible to secure a sufficiently low contact resistance value.

In addition to this, a stripper mainly consisting of the amine system like hydroxylamine and a stripper with about 5 to 25 wt % water added to the principal component of the amine system has an excellent light etching effect, and can remove thin films of aluminum oxides. However, since this kind of stripper is expensive and has a high etching speed to aluminum alloys, its control is rather difficult.

FIG. 12 shows an conceptual diagram of formation of a Ni-concentrated layer on the aluminum alloy surface of the pixel electrode interface as a structure whereby the contact resistance can be further reduced in the aluminum alloy film containing Ni. It is preferable that the thickness of the Ni-concentrated layer is 1 to 10 nm, and Ni concentration is not less than the Ni content inside the thin film of the aluminum alloy and not more than the Ni content inside the aluminum alloy film plus 8 at % (not more than 10 at % if the Ni content inside the aluminum alloy film is 2 at %). For example, it was confirmed, by sectional TEM observation and EDX composition analysis, that a Ni-concentrated layer 4 nm thick whose Ni concentration is 8.7 at % existed in the interface of the Al-2 at % Ni alloy film.

In a Ni containing aluminum alloy, some Ni atoms exist in solution without precipitating. When aluminum is removed by dry etching or alkali etching, since Ni is etched in a low etching rate or is insoluble in alkali, Ni remains on the surface of aluminum as a residue. It is considered that the Ni-concentrated layer is formed in this way. That is, it is considered that Ni whose amount exceeds solid solubility limit of Ni (0.11%) in the aluminum alloy precipitates out by heat treatment etc., and a part of Ni atoms diffuse and concentrate in the aluminum surface to form a Ni-concentrated layer. Possibly it is also considered that since a halogen compound of Ni has low vapor pressure, and is hard to volatilize, the halogen compound assumes a state of remaining on the aluminum alloy surface, and thereby Ni atoms have higher concentration than Ni concentration of bulk aluminum alloy apparently. Also in the etching conditions of a contact hole, if over-etching time (namely, etching time necessary to stabilize the contact resistance with reference to a time required to etch a contact hole by the film thickness depth) is increased twofold, Ni concentration increases to 8.7 at % from 5 at %. Therefore, it is considered from this that there is correlation between the over etching time and Ni concentration.

Ni tends to concentrate near the interface between the aluminum alloy film and the insulating film to some extent, in addition to the interface between the aluminum alloy film and the pixel electrode. The concentration on the interface of the insulating film is less than that on the interface of the pixel electrode. This fact can be explained as that the interface of the pixel is cut in the above mentioned way and the residue is generated. As the reason of concentration of Ni on the interface, besides the factors above, when the aluminum alloy film is heat treated in the state that the insulating film fixes the surface of the aluminum alloy film, a transitional stress distribution generated in the aluminum alloy film possibly diffuses Ni to the interface. Thus, a combination of those plural factors form the Ni-concentrated layer.

When an aluminum alloy film containing Ni is contacted directly to ITO or IZO, the thickness of an aluminum oxide layer which is formed together with precipitates and causes high contact resistance is not more than 4 nm. This thickness is thinner than 5 to 8 nm thickness of an aluminum oxide layer formed in the case of pure aluminum or Al—Nd alloy. Further, in the case of Ni containing aluminum alloy film, the oxygen content in an aluminum oxide layer is 20 at %, which is less than 50 to 60 at % of oxygen content in the case of pure aluminum or Al—Nd alloy. That is, Ni content in an aluminum alloy film is expected to have an effect of suppressing oxidization on the surface of the aluminum alloy film. When the oxygen content in an aluminum alloy film is small, the aluminum alloy film has electric conductivity to some extent and an electric field of a small intensity generated on the interface between the film and ITO or IZO by applying voltage between them is considered to cause break of insulation.

As described above, a combination of the factors, that is, the precipitate, the concentrated layer and the aluminum oxides, results in the decrease of the contact resistance.

Preferable conditions for obtaining such a contact state as described above with Bi selected as an alloy component are: an insulating film (SiN$_x$) is deposited on an aluminum alloy thin film containing Bi of about 0.1 to 6 at %, and subsequently is processed by heat treatment at a temperature of 150 to 400° C., more preferably at a temperature of 200 to 350° C., for about 15 minutes to 1 hour, whereby Bi is made to precipitate out in the aluminum grain boundary. Then, the aluminum alloy thin film is subjected to over-etching whose time is by approximately 10% larger than etching time necessary to etch the insulating film by means of dry etching at the time of contact hole formation, and its surface is further subjected to light etching using a stripper of the amine system, whereby precipitate of Bi is formed in the interface of the ITO/Al—Bi alloy film. At this time, the size and the number of Bi precipitate can be adjusted by the addition of Bi, the temperature and time of the heat treatment, the amount of over-etching, etc.

FIG. 13 is a conceptual diagram showing a state where an alloy component (a solute element) and elements (In, Sn, etc.) constituting the pixel electrode 5 are interdiffused, and an interdiffusion layer of the solute element, and In and Sn is formed in the interface of the aluminum alloy film and the pixel electrode 5, whereby electrical conduction is established. That is, when Sm is selected as the solute element, the contact state as shown in the example of illustration is obtained depending on the deposition conditions.

Specific conditions for obtaining such a contact state as described above with Sm selected as an alloy component are: an insulating film (SiN$_x$) is deposited on an aluminum alloy thin film containing Sm of about 0.1 to 6 at %, and subsequently is processed by heat treatment at a temperature of 150 to 400° C., more preferably at a temperature of 200 to 350° C., for about 15 minutes to 1 hour, whereby Sm is made to precipitate out in the aluminum grain boundary. Then, the aluminum alloy thin film is subjected to over-etching whose time is by approximately 10% larger than an etching time necessary to etch the insulating film by means of dry etching at the time of the contact hole formation, and its surface is further subjected to light etching using a stripper of the amine system. Consequently, Sm etc. remaining as a residue is considered to be selectively oxidized into a surface face layer. Since the surface layer is coarser than an aluminum oxide, current flows easily. It is considered that the current contributes to lowering the resistance of the interface. Further, a diffusion layer of In and Sn in ITO and Sm is formed in the interface of the ITO/Al—Sm alloy film by depositing an ITO film on the surface layer. It is preferable to set the thickness of the diffusion layer in a range of 5 to 50 nm, and this thickness may be adjusted by the addition of Sm, the temperature and time of the heat treatment, the amount of over-etching, etc.

In the both examples shown in the FIGS. 12 and 13, since an insulating layer is not easily formed in the interface between the aluminum alloy film and the pixel electrode, the aluminum alloy film and the pixel electrode are directly connected, and consequently reliable connection with lower resistance is realized.

The planar display device equipped with the TFT array substrate thus formed is used, for example, as a liquid crystal display, contact resistance between the pixel electrode and the connection wiring section can be suppressed to the minimum; therefore, detrimental effects on the display quality can be prevented as much as possible.

Next, a structure of the thin film transistor according to the second embodiment applied to the array substrate of this invention will be described.

Figure 14:
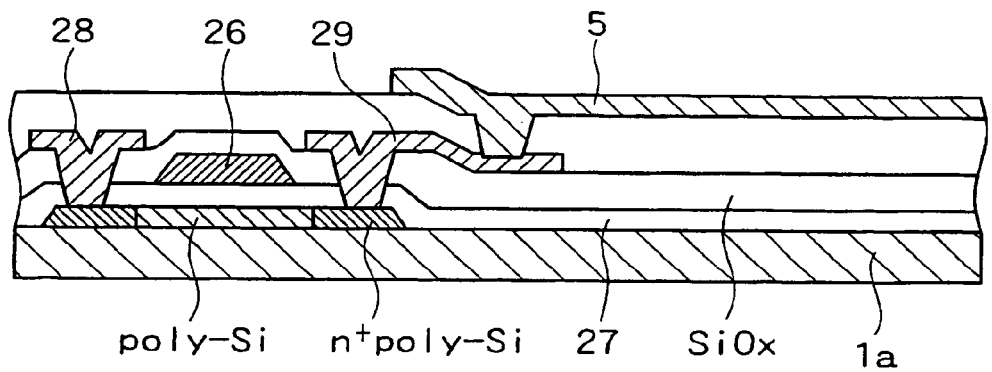
FIG. 14 is a schematic sectional explanatory diagram illustrating the structure of the thin film transistor applied to the array substrate for display devices according to the second embodiment of this invention.

FIG. 14 is an enlarged sectional explanatory diagram schematically showing a structure of the thin film transistor according to the second embodiment applied to the array substrate of this invention, and the thin film transistor of a top gate structure is applied in this example.

As shown in FIG. 14, a scan line is formed of an aluminum alloy thin film on a glass substrate 1$a$, and a part of the scan line functions as the gate electrode 26 for controlling turning on and off of the thin film transistor. Moreover, the signal conductor is formed with an aluminum alloy so as to intersect with the scan line through the layer insulation film ($SiO_x$), and a part of the signal line functions as the source electrode 28 of the thin film transistor.

The pixel electrode 5 formed of, for example, an ITO film with SnO contained in $In_2O_3$ is arranged on the pixel area on the layer insulation film ($SiO_x$), and the drain electrode 29 of the thin film transistor formed of an aluminum alloy functions as a connection electrode section that is electrically connected to the pixel electrode 5. That is, the drain electrode 29 of the thin film transistor formed of the aluminum alloy directly contacts the pixel electrode 5, establishing electric connection.

Therefore, as is the case with the example of the FIG. 2, when a gate voltage is supplied to the gate electrode 26 through the scan line, the thin film transistor is switched on, and a drive voltage supplied in advance on the signal conductor is supplied from the source electrode 28 to the pixel electrode 5 through the drain electrode 29, and when the drive voltage at a predetermined level is supplied to the pixel electrode 5, an electric potential difference is generated between itself and the opposed substrate 2, as described in FIG. 1, which makes liquid crystal molecules contained in the liquid crystal layer 3 oriented to perform light modulation.

Next, a method of manufacture of the TFT array substrate shown in FIG. 14 will be explained. The thin film transistor that is provided for the array substrate according to this second embodiment is of a top gate structure that uses a polysilicon film (poly-Si) as a semiconductor layer, and FIG. 15 through FIG. 21 are figures schematically showing the manufacturing process of the TFT array substrate according to the second embodiment.

Figure 15:
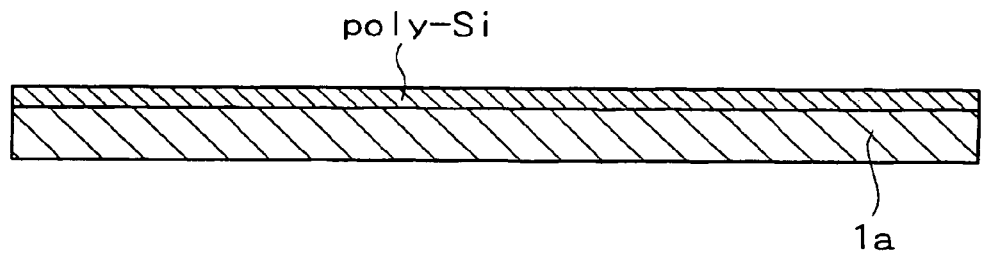
FIG. 15 is an explanatory diagram showing one example of the manufacturing process of the array substrate for display devices shown in the FIG. 14 in order.

First, a silicon nitride film ($SiN_x$) with a thickness of about 50 nm and a silicon oxide film ($SiO_x$) with a thickness of about 100 nm, and further a hydrogenated amorphous silicon film (a-Si:H) with a thickness of, for example, about 50 nm are deposited on the glass substrate 1a by, for example, a plasma CVD method etc. at a substrate temperature of, for example, about 300° C., and are processed by heat treatment and laser annealing in order to transform the hydrogenated amorphous silicon film (a-Si:H) into polysilicon. The heat treatment is performed as atmosphere heat treatment at, for example, 470° C. for about 1 hour, performing a dehydrogenated treatment, and subsequently a laser is irradiated onto the hydrogenated amorphous silicon film (a-Si:H) using, for example, an excimer laser annealer under an energy condition of, for example, approximately 230 $mJ/cm^2$, thereby obtaining a polysilicon film (poly-Si) with a thickness of, for example, about 0.3 µm (FIG. 15).

Figure 16:
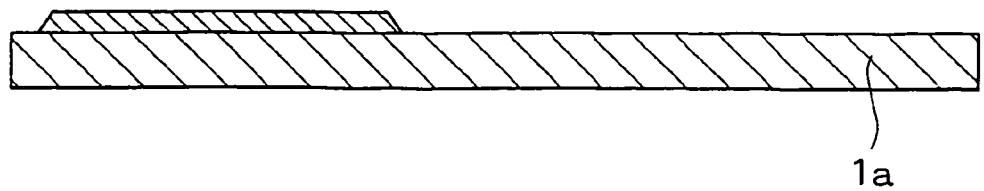
FIG. 16 is an explanatory diagram showing one example of the manufacturing process of the array substrate for display devices shown in the FIG. 14 in order.
Figure 17:
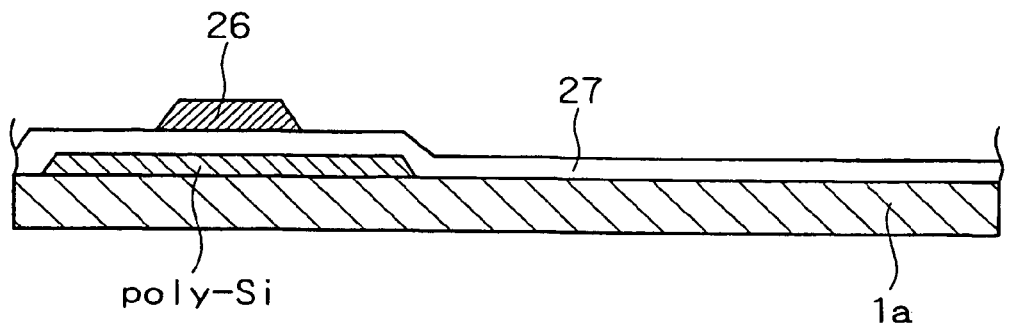
FIG. 17 is an explanatory diagram showing one example of the manufacturing process of the array substrate for display devices shown in the FIG. 14 in order.

Then, as shown in FIG. 16, the polysilicon film (poly-Si) is patterned by plasma etching etc. Subsequently, as shown in FIG. 17, a silicon oxide film ($SiO_x$) is deposited to a thickness of, for example, about 100 nm to prepare the gate insulating film 27. On the gate insulating film 27 obtained, an aluminum alloy film that will be the gate electrode 26 integral with the scan line is deposited by sputtering etc. to a thickness of, for example, about 200 nm, and subsequently is patterned by a method of plasma etching etc., whereby the gate electrode 26 integral with the scan line is formed.

Figure 18:
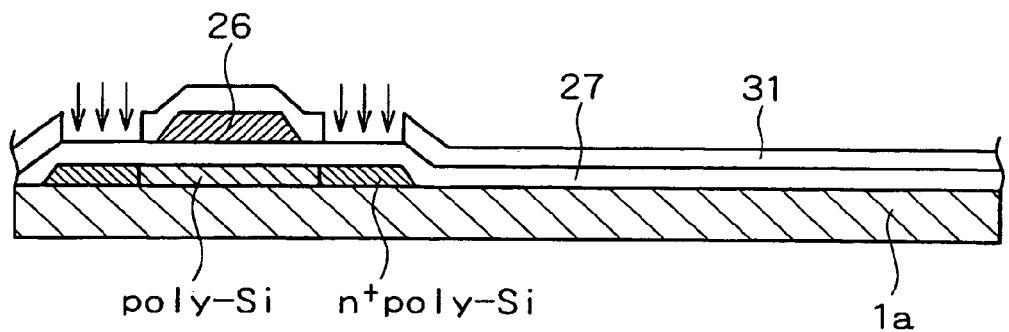
FIG. 18 is an explanatory diagram showing one example of the manufacturing process of the array substrate for display devices shown in the FIG. 14 in order.

Subsequently, as shown in FIG. 18, a mask is formed with the photoresist 31, a dopant, for example phosphor, is doped at about 50 KeV to a doping concentration of $1 \times 10^{15}$ atom/$cm^2$, $n^+$ type polysilicon film ($n^+$poly-Si) is formed on a part of the polysilicon film (poly-Si), after that the photoresist 31 is stripped, and the dopant is made to diffuse by heat treatment at, for example, about 500° C.

Figure 19:
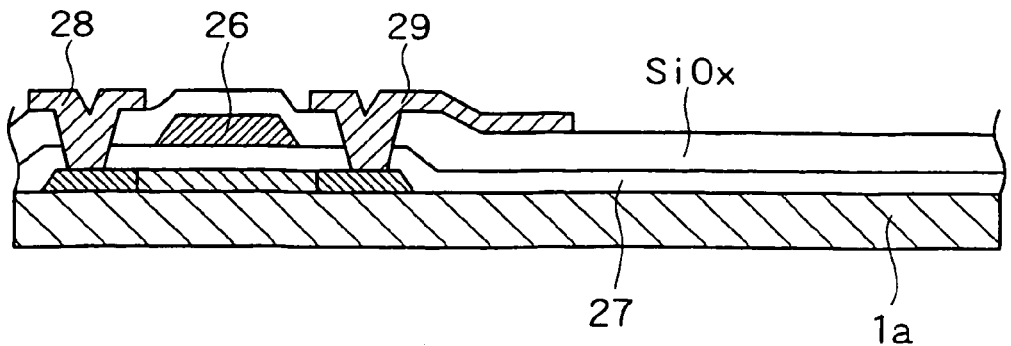
FIG. 19 is an explanatory diagram showing one example of the manufacturing process of the array substrate for display devices shown in the FIG. 14 in order.

Subsequently, as shown in FIG. 19, a silicon oxide film ($SiO_x$) is deposited to a thickness of, for example, about 500 nm, at a substrate temperature of about 300° C. using a plasma CVD apparatus etc. to form a layer insulation film ($SiO_x$), the photoresist is patterned similarly, whereby the layer insulation film ($SiO_x$) and the silicon oxide film of the gate insulating film 27 are dry-etched to form a contact hole, the aluminum alloy film is deposited to a thickness of, for example, about 450 nm by sputtering, and subsequently patterned, whereby the source electrode 28 and the drain electrode 29 integral with the signal conductor are formed. Consequently, the source electrode 28 and the drain electrode 29 are brought into contact with the $n^+$ type polysilicon film ($n^+$poly-Si) through contact holes, respectively.

Figure 20:
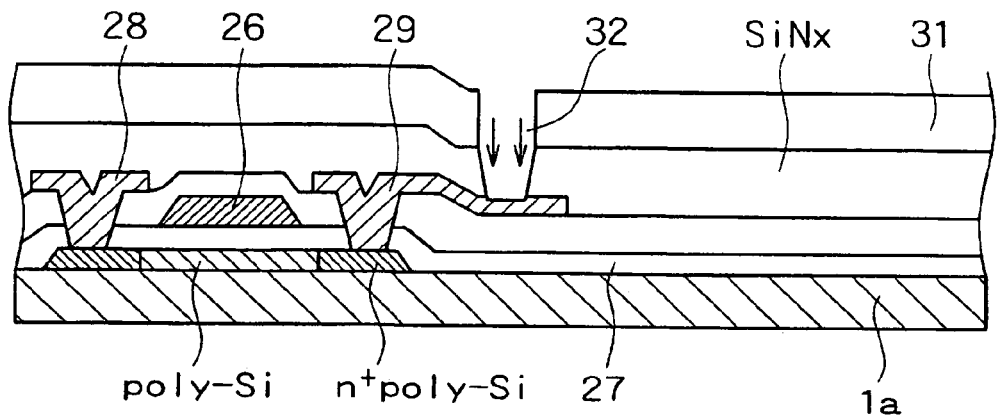
FIG. 20 is an explanatory diagram showing one example of the manufacturing process of the array substrate for display devices shown in the FIG. 14 in order.

Then, as shown in FIG. 20, a silicon nitride film ($SiN_x$) is deposited by a plasma CVD apparatus etc. to a film thickness of, for example, about 500 nm at a substrate temperature of about 300° C. to prepare a layer insulation film. Then, the photoresist layer 31 is formed thereon, the silicon nitride film ($SiN_x$) is patterned, the contact hole 32 is formed in the silicon nitride film ($SiN_x$) by, for example, dry etching, and subsequently over-etching is applied for a time of a time required for etching the silicon nitride film plus 10%. By this treatment, the aluminum alloy surface is also etched by about a few tens of nm.

Figure 21:
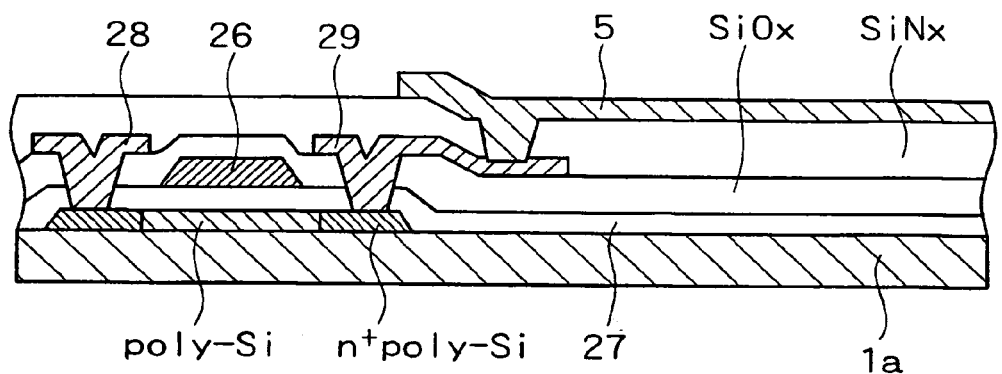
FIG. 21 is an explanatory diagram showing one example of the manufacturing process of the array substrate for display devices shown in the FIG. 14 in order.

Subsequently, as shown in FIG. 21, after being subjected to an ashing process using, for example, oxygen plasma, the substrate is subjected to photoresist stripping using a stripper of the amine system similarly with the case. Following this, the ITO film with a thickness of about 100 nm is deposited by, for example, sputtering, and is subjected to patterning by wet etching to form the pixel electrode 5. By this processing, the drain electrode 29 contacts the pixel electrode 5 directly.

Subsequently, in order to stabilize characteristics of transistors, the TFT array substrate is annealed at, for example, about 350° C. for about 1 hour to complete a polysilicon TFT array substrate.

With the TFT array substrate according to the second embodiment described above and the liquid crystal display equipped with the TFT array substrate, an effect equivalent to that of the first embodiment explained previously can be obtained. Moreover, also in the second embodiment as in the case of the first embodiment, the aluminum alloy of this invention can be used also as reflective electrodes of reflective liquid crystal displays.

Note that as a raw material of the pixel electrode 5, indium tin oxide or indium zinc oxide is suitable, and it is preferable that the aluminum alloy film is such that a part or all of alloy components forming a solid solution in a non-equilibrium state is made to form a precipitate or a concentrated layer, whose electrical resistivity is adjusted to 8 µΩ·cm or less, more preferably 5 µΩ·cm or less. In addition, it is preferable that regarding the precipitate (intermetallic compound) that exists in the contact interface between the aluminum alloy film and the pixel electrode, particles of the precipitate (intermetallic compound) are made to have sizes of more than 0.01 µm in major diameter, and are made to exist so that the number thereof exceeds 0.13 particle/100 $µm^2$, whereby the contact resistance can be reduced intentionally.

Moreover, in putting the method of manufacture to practice, if a part or all of alloy components (especially, Sm) forming a solid solution in a non-equilibrium state in the aluminum alloy and alloy components of the pixel electrode are made to diffuse into each other by heat treatment, preferably at a temperature of 150 to 400° C. for 15 minutes or more, a precipitate can be formed easily in the contact interface between the aluminum alloy film and the pixel electrode. Moreover, as a method of forming the aluminum alloy film, there can be enumerated vacuum deposition methods, sputtering methods, etc. Among them, the sputtering methods are especially preferable.

Then, it is preferable that an insulating film is formed on the aluminum alloy film to make a lamination, contact hole etching is performed on the insulating film, and successively after this the aluminum alloy film is subjected to light etching by 1 to 200 nm, more preferably 3 to 100 nm, from the aluminum alloy surface, and thereby a precipitate of a part or all of alloy components forming a solid solution in a non-equilibrium state is exposed partly, because contact resistance between itself and the pixel electrode formed thereon can be reduced even further.

The light etching can be performed by dry etching using a gas capable of etching the aluminum alloy film or by wet etching using a chemical capable of etching the aluminum alloy film. For a chemical used in the light etching process, it is recommended that a stripper for a photoresist used in patterning is used.

The liquid crystal display as a planar display device as shown in the FIG. 1 is completed using the TFT array substrate thus obtained.

That is, an oriented film is formed by applying, for example, a polyimide on the surface of the TFT array substrate 1 completed as described above and performing rubbing after it is dried.

On the other hand, as for an opposed substrate 2, first the light shielding film 9 is formed on the glass substrate by patterning, for example, chromium in a matrix manner. Then, the light filter 8 of red, green, and blue made of resins are formed in the gap of the light shielding film 9. The counter electrode is formed by arranging a transparent conductive film, such as ITO, as the common electrode 7 on this light shielding film 9 and the color filter 8. Then, the oriented film 11 is formed by applying, for example, a polyimide on the top layer of the counter electrode and performing the rubbing after it is dried.

Subsequently, the two substrates of the array substrate 1 and the opposed substrate 2 are glued with a sealant 16, such as of made of resin, except for the enclosure mouth for the liquid crystal with surfaces of the two substrates on each of which the oriented film 11 is formed disposed in opposition to each other. At this time, the gap between two substrates is maintained roughly constant by disposing a spacer 15 between the two substrates or by other means.

The empty cell thus obtained is placed in a vacuum and the vacuum is allowed to go back to atmospheric pressure gradually with the enclosure mouth dipped in the liquid crystal, thereby a liquid crystal material containing liquid crystal is poured into the empty cell to form a liquid crystal layer, and the enclosure mouth is sealed. Finally, the polarizing plates 10 are glued on both faces of the outside of the cell to complete a liquid crystal panel.

Moreover, as shown in FIG. 1, a driver circuit for driving the liquid crystal display is electrically connected to the liquid crystal panel, and is placed on the side or the back part of the liquid crystal panel. Then the liquid crystal panel is retained by a frame including an opening that determines a display plane of the liquid crystal, the backlight 22 acting as a planar light source, a light guiding plate 20, and a retaining frame 23, whereby the liquid crystal display device is completed.

EMBODIMENTS

Next, Table 1 shows measurement results of the contact resistance between the pixel electrodes 5 and the aluminum alloy film when the aluminum alloy film directly contacts the pixel electrode 5 on the array substrate according to this invention.

The measurement experiment was conducted as follows.

1) Composition of pixel electrode: indium tin oxide (ITO) with 10 wt % tin oxide added to indium oxide, or indium zinc oxide (IZO) with 10 wt % zinc oxide added to indium oxide. Each film thickness is 200 nm.

2) Composition of aluminum wiring film: alloy component contents are as shown in Table 1.

3) Heat treatment conditions: After depositing an insulating film ($SiN_x$) with a thickness of 300 nm, it is processed by heat treatment in a vacuum at 300° C. for 1 hour.

4) Light etching: The insulating film ($SiN_x$) is dry-etched using fluorine system plasma, and successively after this each aluminum wiring material is etched by approximately 10 nm and further etched using a stripper (a product of TOKYO OHKA KOGYO CO., LTD. "Stripper 106") together with a contamination layer of the surface by approximately 5 nm, 15 nm in total (5% of the film thickness).

Figure 22:
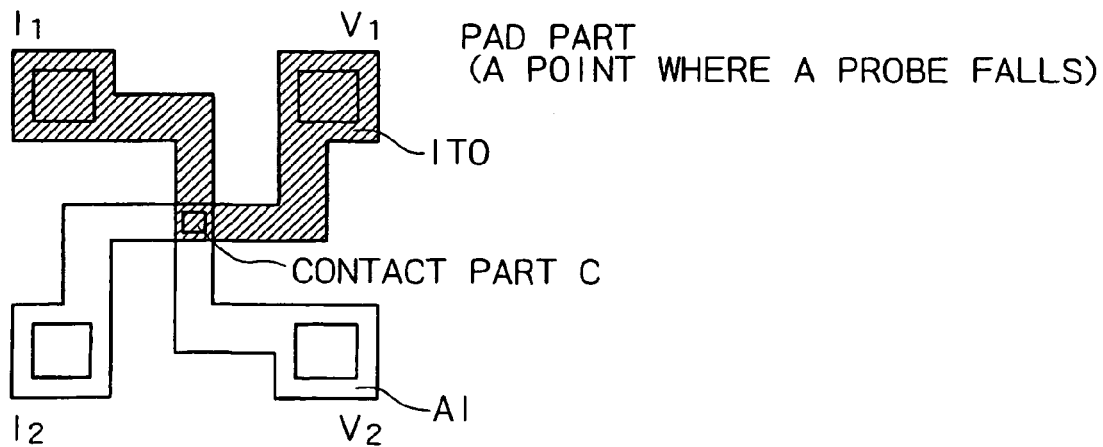
FIG. 22 is a diagram showing a Kelvin pattern used to measure the contact resistance of the aluminum alloy and the pixel electrode.

5) Contact resistance measuring method:

A Kelvin pattern as shown in FIG. 22 is made, four terminal measurement [a method in which current is fed through ITO (or IZO)-Al alloy, and a voltage drop between ITO (or IZO)-Al alloy is measured with different terminals] is performed. That is, by feeding a current I between I1 and I2 of FIG. 22 and monitoring a voltage V between V1 and V2, the contact resistance R of the contact part C is found as [R=(V2−V1)/I2]. Incidentally, a method of producing the pattern was as shown in the following.

Moreover, measurement of the alloying element in the aluminum alloy was performed by the ICP emission spectrometry (inductively coupled plasma atomic emission spectrometry).

In order to achieve insulation between the surface and the substrate, a silicon wafer on whose surface an oxide film ($SiO_2$ thermal oxide film) 400 nm thick was formed is used instead of the glass substrate, an Al alloy 300 nm thick is deposited thereon and patterned, and subsequently an insulating film ($SiN_x$) 300 nm thick is deposited by a VD method. Then, the wafer, as it is, is processed by heat treatment in a vacuum deposition chamber for 1 hour and is taken out. Subsequently, a contact hole of an 80-μm square is patterned by photolithography, and the contact hole is formed by performing etching using fluorine system plasma. At this time, over etching is performed for 10% in terms of time, in addition to the etching time of the insulating film. By this process, the surface of the aluminum alloy film is removed by approximately 10 nm (3.3% of the film thickness).

Then, resist stripping is performed with oxygen plasma ashing and stripper. Incidentally, for the stripper, a product of TOKYO OHKA KOGYO CO., LTD. "Stripper 106" is used and the aluminum alloy is washed at 100° C. for 10 minutes. At this time, contaminations, such as fluorides, oxides, and carbon, formed on the surface of the aluminum alloy are removed (about a few nm in thickness). Then, ITO (or IZO) 200 nm thick is deposited by sputtering, and the patterning is performed.

Next, for measurement of contact resistance, a manual prober with four terminals and a semiconductor parameter analyzer "HP4156A" (product of Hewlett-Packard Co.) were used. In this measurement, the contact resistance is expressed by R (contact resistance)=[I2/(V2−V1)]; a pure resistance value of a junction of the ITO (or IZO)/Al alloy except influences of the wiring resistance can be measured.

In addition, when the sizes and number of the particles of the precipitates that exist in the junction of the ITO (or IZO)/

Al alloy in the contact hole were measured by observation with a scanning electron microscope and second-order mapping of components by Auger spectroscopy, in the case of Al—Ag, it was confirmed that the particles of the precipitates having sizes of about 0.3 µm or so existed with a density of 1 particle/100 µm$^2$ or more. In the case of Al—Zn, when the sizes and number of the particles of the precipitates that exist in the junction of the IZO/Al alloy in the contact hole were measured similarly, it was confirmed that particles of the precipitates, all of which measure about 0.3 µm or so in size, existed with a density of 3 particles/100 µm$^2$ or more.

Note that in an alloy with Nd, Y, Fe, and/or Co added to the aluminum alloy, the size of a precipitate becomes small generally because the grain size of the structure becomes minute. For example, in order to find the size of a precipitate existing in the junction of the ITO/Al alloy, the structure in a thin film of the aluminum alloy was observed by plane-view TEM because it is difficult to perform TEM observation of the junction interface of the ITO/Al alloy. Precipitates of the following sizes were observed: a major diameter of 0.05 µm in an Al—Ni alloy; a major diameter of 0.02 to 0.04 µm in an Al—Ni—Nd alloy; and a major diameter of 0.01 to 0.03 µm in an Al—Ni—Y alloy. It is considered that the sizes of the precipitates in the interface are the same as these.

TABLE 1

| Metal electrode film | Content of alloy component (at %) | Pixel electrode | |
|---|---|---|---|
| | | ITO | IZO |
| Mo | — | $7.4 \times 10^1$ Ω | $8.1 \times 10^0$ Ω |
| Pure Al | — | $1.5 \times 10^5$ Ω | — |
| Al—Nd | 0.6 | $8.4 \times 10^4$ Ω | $1.4 \times 10^5$ Ω |
| Al—Au | 3.4 | $7.6 \times 10^1$ Ω | $1.2 \times 10^1$ Ω |
| Al—Ag | 3.8 | $5.7 \times 10^1$ Ω | $9.4 \times 10^0$ Ω |
| Al—Zn | 2.4 | $9.3 \times 10^1$ Ω | $9.9 \times 10^0$ Ω |
| Al—Sr | 1.1 | $2.3 \times 10^1$ Ω | $1.4 \times 10^1$ Ω |
| Al—Bi | 0.9 | $9.2 \times 10^1$ Ω | $2.3 \times 10^1$ Ω |
| Al—Ni | 1.4 | $1.7 \times 10^1$ Ω | $9.9 \times 10^0$ Ω |
| Al—Sm | 0.5 | $8.6 \times 10^1$ Ω | $1.1 \times 10^1$ Ω |
| Al—Ge | 1.1 | $2.3 \times 10^1$ Ω | $1.3 \times 10^1$ Ω |
| Al—Cu | 4.1 | $2.3 \times 10^2$ Ω | $1.3 \times 10^6$ Ω |

As is clear from Table 1, in the case where the pure aluminum wiring is brought into direct contact with the TFT film, the contact resistance is $1.5 \times 10^5$ Ω; and moreover, in the case where an Al—Nd alloy that is a typical aluminum alloy film is brought in-to direct contact with the ITO film, the contact resistance is $8.4 \times 10^4$ Ω. Moreover, the contact resistance in the case where Mo is disposed between the ITO film and Al—Nd wiring as a barrier metal, as the conventional structure, was $7.4 \times 10^1$ Ω.

On the other hand, the contact resistance of Al—Au wiring is $7.6 \times 10^1$ Ω, the contact resistance of Al—Ag wiring is $5.7 \times 10^1$ Ω, the contact resistance of Al—Zn wiring is $9.3 \times 10^1$ Ω, the contact resistance of Al—Cu wiring is $2.3 \times 10^2$ Ω, the contact resistance of Al—Ni wiring is $1.7 \times 10^1$ Ω, the contact resistance of Al—Sr wiring is $2.3 \times 10^1$ Ω, the contact resistance of Al—Sm wiring is $8.6 \times 10^1$ Ω, the contact resistance of Al—Ge wiring is $2.3 \times 10^1$ Ω, and the contact resistance of Al—Bi wiring is $9.2 \times 10^1$ Ω; any of the contact resistance is roughly equal to that in the case where Mo is used as the barrier metal, i.e., the conventional structure.

Table 1 also shows the result when an IZO film that contains Zn whose ionization potential is as high as that of aluminum and that is excel in reducibility resistance is used, collectively.

The IZO film is a transparent film with about 10 wt % ZnO added to $In_2O_3$. In this case, the contact resistance decreased further to a few tenths of that of the ITO film. As this reason, the following two are considered.

First, one of the reasons is attributed to a fact that, since the electric potential (work function) of IZO is higher than that of ITO, even if an extremely thin insulating material layer is formed in the interface between the aluminum alloy wiring and the pixel electrode, and is of a MIM structure (Metal-Insulator-Metal) consisting of metal-insulating film-pixel electrode; the pixel electrode having a high work function sees the thickness of the insulating film in the interface thinner than appearance when an electric potential difference is applied, and hence a tunneling current component will increase.

Second, the other of the reason is attributed to a fact that, since Zn in IZO has a high ionization potential compared to Sn in ITO, having the nature of being hard to reduce in the presence of aluminum; an insulating substance is hard to form in the interface between the aluminum alloy and the pixel electrode.

Incidentally, the contact area between the pixel electrode and the contact wiring section used in the measurement was set to an 80-µm square.

With respect to the binary alloy, Table 3 shows data regarding: contact resistance with ITO when the addition of the solute element is varied, wiring resistance after heat treatment at 300° C. for 1 hour, and the area factor of the precipitate when the alloy film was observed by plane-view TEM after the heat treatment at 300° C. for 1 hour. The table also shows precipitates observed at this time. The contact resistance was evaluated by manufacturing an evaluation element as an experiment similarly as in Table 1. Incidentally, the composition means the content of the solute element contained in the aluminum alloy. In plane-view TEM observation, the alloy wiring part was sliced in parallel with the surface, and a state of the internal structure of the alloy was observed. With increasing content of the solute element, the contact resistance of ITO decreases, and the resistance increases. The area factor of the precipitate has correlation with the composition, and the contact resistance and the area factor of the precipitate are in an inverse proportional relationship.

Incidentally, the area factor of the precipitate is a value obtained by identifying the precipitate appearing in the field of sight of a 0.3-µm square by plane-view TEM observation at a magnification of 500,000 and finding a ratio to the Al phase by calculation. According to this, in any aluminum alloy, a contact resistance becomes 200 Ω at an area factor of around 0.5%, and becomes less than 200 Ω at an area factor of more than 0.5%. Assuming that a current component flowing through this precipitate is a main current component, the area factor is a factor that mainly determines the contact resistance, although it depends on the electrical resistivity of the precipitate.

Compositions of the precipitates were found from results of quantification through composition analysis using EDX and results of X-ray diffraction for two or more precipitates that were observed using the same plane-view TEM observation sample.

For example, in a Ni-containing aluminum alloy, the conductive precipitate contains at least one kind of substance selected from the group consisting of $Al_3Ni$, $Al_3Ni_2$, AlNi, and $AlNi_3$; in a Ag-containing aluminum alloy, the conductive precipitate contains at least one kind of substance selected from the group consisting of Ag, $Al_2Ag$, and AlAg; in a Zn-containing aluminum alloy, the conductive precipitate contains at least one kind of substance selected from the group consisting of AlZn, Zn, and ZnO; and in a Cu-containing aluminum alloy, the conductive precipitate contains at least one kind of substance selected from the group consisting of AlCu, Cu, CuO, and $Cu_2O$.

On the other hand, Table 4 below shows: for an Al—Ag alloy with Ag content fixed to 2 at %, the number of the precipitate particles appearing on the bottom of the contact hole of a 10-μm square that was found by calculation from the number of precipitate particles 0.3 μm or more in major diameters that show themselves in the field of view of a 1.5-μm square when observing the contact bottom, namely the uppermost surface of the contact portion of the Al—Ag alloy, by surface SEM observation at a magnification of 60,000, and the contact resistance with ITO at that time, in the case where the etching depth from the surface of the Al—Ag alloy is changed in the range of 0 to 50 mm by changing the amount of over-etching. In addition, this is because almost all precipitate particles can be counted in the Al—Ag alloy. At this time, counting the number of precipitate particles is performed by observation image, EDX, and second-order mapping by Auger.

When the etching depth becomes large and the number of precipitate particles that can be found by SEM observation of the surface increases, the contact resistance reduces. Therefore, this phenomenon is considered to indicate that when the etching depth becomes large, the conductive precipitate starts to emerge in the Al—Ag alloy surface gradually, and accordingly the contact area between the conductive precipitate and ITO deposited in the subsequent process increase, thereby reducing the contact resistance. Then, when the etching depth exceeds 30 nm or so, the number of the precipitate particles calculated by SEM observation of the surface converges, and along with this, the contact resistance converges to a constant value.

Next, in the case where the solute element is specified as Ag or Zn in the structure shown as the FIG. 11, the relationship between the contact resistance of each alloy shown in the Table 1 and the density of the precipitate of the solute element or the intermetallic compound of the solute element including aluminum becomes a value shown in Table 2. This table shows required number of precipitate particles estimated by calculation when the contact resistance is assumed 200 Ω. On the other hand, values of the number of precipitate particles in this table are calculation results for the case where the contact resistance is 200 Ω: in the embodiment, the contact resistance of Al-3.8 at % Ag was 58 Ω, and the contact resistance of Al-2.4 at % Zn was 93 Ω.

If all the precipitate particles are assumed to be of a round shape with a diameter of 0.03 μm, the number of precipitate particles is found to be 45 particles (in a 10-μm square) in the case of Al-3.8 at % Ag, and 110 particles (in a 10-μm square) in the case of Al-2.4 at % Zn, as shown in Tables 5 and 6 by estimating the number of precipitate particles by calculation from the contact resistance value in the embodiment.

Moreover, if the precipitate particles in Al—Ag are assumed to be of a round shape with a diameter of 0.1 μm that is observed actually by a plane-view TEM or scanning electron microscope, the number of precipitate particles becomes 0.5 particle (in a 10-μm square). In the case of Al—Ag, although the addition is different, an estimate becomes almost of the same order as the number of precipitate particles counted experimentally and shown in Table 4. Incidentally, in the case of IZO, that is considered because a high resistance layer is prevented from being formed in an area except the precipitate and current increment in the area except the precipitate contributes to electrical conductivity due to a fact that Zn has high reducibility resistance and is considered to have an effect of preventing Al from being oxidized by contacting IZO.

TABLE 2

| | Zn | | Ag | |
|---|---|---|---|---|
| Diameter (μm) | particles/ 80-μm square | particles/ 10-μm square | particles/ 80-μm square | particles/ 10-μm square |
| 1 | 2.958 | 0.046 | 0.750 | 0.012 |
| 0.5 | 11.833 | 0.185 | 2.999 | 0.046 |
| 0.3 | 32.869 | 0.514 | 8.330 | 0.128 |
| 0.1 | 295.817 | 4.622 | 74.972 | 1.153 |
| 0.05 | 1183.270 | 18.489 | 299.886 | 4.614 |
| 0.03 | 3286.861 | 51.357 | 833.017 | 12.816 |
| 0.01 | 29500.000 | 462.215 | 7497.155 | 115.341 |
| 0.001 | 2950000.000 | 46221.479 | 750000.000 | 11534.085 |

TABLE 3

| Al alloy component | Composition (at %) | Contact resistance with ITO (Ω) | Wiring resistance after heat treatment at 300° C. (μΩ · cm) | Area factor of precipitate by plane-view TEM | Main conductive precipitates |
|---|---|---|---|---|---|
| Al—Ni | 0.1 | 3080 | 3.3 | 0.13 | $Al_3Ni$, $Al_3Ni_2$, |
| | 0.3 | 512 | 3.5 | 0.39 | AlNi, $AlNi_3$ |
| | 0.5 | 152 | 3.5 | 0.65 | |
| | 1 | 178 | 3.6 | 1.3 | |
| | 2 | 128 | 3.6 | 2.6 | |
| | 5 | 99 | 3.9 | 6.5 | |
| Al—Ag | 0.1 | 417 | 3.6 | 0.15 | Ag, $Al_2Ag$, |
| | 0.3 | 250 | 4.1 | 0.44 | AlAg |
| | 0.5 | 202 | 4.1 | 0.73 | |
| | 1 | 198 | 4.4 | 1.5 | |
| | 2 | 31 | 4.6 | 2.9 | |
| | 5 | 55 | 3.8 | 7.3 | |
| Al—Zn | 0.1 | 6400 | 4 | 0.11 | AlZn, Zn, |
| | 0.3 | 820 | 3.9 | 0.33 | ZnO |
| | 0.5 | 245 | 4.1 | 0.55 | |
| | 1 | 182 | 4.1 | 1.1 | |
| | 2 | 158 | 4.1 | 2.2 | |
| | 5 | 157 | 4.3 | 5.5 | |

TABLE 3-continued

| Al alloy component | Composition (at %) | Contact resistance with ITO ($\Omega$) | Wiring resistance after heat treatment at 300° C. ($\mu\Omega \cdot cm$) | Area factor of precipitate by plane-view TEM | Main conductive precipitates |
|---|---|---|---|---|---|
| Al—Cu | 0.1 | 2238 | 3.3 | 0.12 | AlCu, Cu, CuO, $Cu_2O$ |
|  | 0.3 | 499 | 3.7 | 0.36 |  |
|  | 0.5 | 228 | 3.9 | 0.6 |  |
|  | 1 | 158 | 4.1 | 1.2 |  |
|  | 2 | 74 | 4 | 2.4 |  |
|  | 5 | 54 | 4.5 | 6 |  |
| Al—Au | 2 | 76 | 3.8 | 3.2 | $Al_2Au$, AlAu |
| Al—Ge | 2 | 123 | 3.8 | 0.7 | AlGe, Ge |
| Al—Sr | 2 | 23 | 4.9 | 2.5 | AlSr |
| Al—Sm | 2 | 86 | 4.3 | 2.4 | AlSm |
| Al—Bi | 2 | 92 | — | 1.1 | Bi |
| Pure Al | — | 150,000 | 2.6 | — |  |
| Pure Mo | — | 74 | 5.1 | — |  |
| Al—Nd | 2 | 131,000 | 4.9 | 2.6 | ($Al_3Nd$, $Al_4Nd$: non-conductive) |

TABLE 4

| Al alloy component | Composition (at %) | Etching depth (nm) | Number of precipitate particles each having a major diameter of 0.1 μm or more (particles/ 10-μm square) | Contact resistance with ITO ($\Omega$) |
|---|---|---|---|---|
| Al—Ag | 2 | 0 | 6 | 225 |
|  |  | 10 | 16 | 78 |
|  |  | 20 | 22 | 54 |
|  |  | 30 | 30 | 39 |
|  |  | 40 | 35 | 33 |
|  |  | 50 | 37 | 31 |

TABLE 5

Size and density of precipitate particles of the solute element satisfying a specified contact resistance of 57 $\Omega$/ 80-μm square that is the same as measured value in Al—Ag

| | Ag | |
|---|---|---|
| Diameter (.m) | particles/ 80-μm square | particles/ 10-μm square |
| 1 | 2.63 | 0.04 |
| 0.5 | 10.52 | 0.16 |
| 0.3 | 29.23 | 0.45 |
| 0.1 | 263.06 | 4.05 |
| 0.05 | 1052.23 | 16.19 |
| 0.03 | 2922.87 | 44.97 |
| 0.01 | 26305.81 | 404.70 |
| 0.001 | 2631578.95 | 40470.47 |

TABLE 6

Size and density of precipitate particles of the solute element satisfying a specified contact resistance of 93 $\Omega$/ 80-μm square that is the same as measured value in Al—Zn

| | Zn | |
|---|---|---|
| Diameter (.m) | particles/ 80-μm square | particles/ 10-μm square |
| 1 | 6.36 | 0.10 |
| 0.5 | 25.45 | 0.40 |

TABLE 6-continued

Size and density of precipitate particles of the solute element satisfying a specified contact resistance of 93 $\Omega$/ 80-μm square that is the same as measured value in Al—Zn

| | Zn | |
|---|---|---|
| Diameter (.m) | particles/ 80-μm square | particles/ 10-μm square |
| 0.3 | 70.69 | 1.10 |
| 0.1 | 638.17 | 9.94 |
| 0.05 | 2544.67 | 39.76 |
| 0.03 | 7068.52 | 110.45 |
| 0.01 | 63440.86 | 994.01 |
| 0.001 | 6344086.02 | 99401.03 |

Next, embodiments of ternary alloys will be described.

As in the cases of binary alloys, contact resistance with ITO through a contact hole of an 80-μm square was measured. The contact resistance of an Al—Ag—Nd film was $1.3 \times 10^2$ $\Omega$, the contact resistance of an Al—Zn—Nd film was $4.3 \times 10^2$ $\Omega$, and the contact resistance of an Al—Ni—Nd film was $1.7 \times 10^2$ $\Omega$; although the contact resistance of any film was slightly higher than that of a case of the conventional structure where Mo was used for the barrier metal, they were in a level causing no problem. Also in other elements of Au, Ge, Sr, Sm, and Bi, the contact resistance was in the range of $1.0 \times 10^2$ to $5.0 \times 10^3$ $\Omega$, which were almost equal to the above.

Figure 24A:
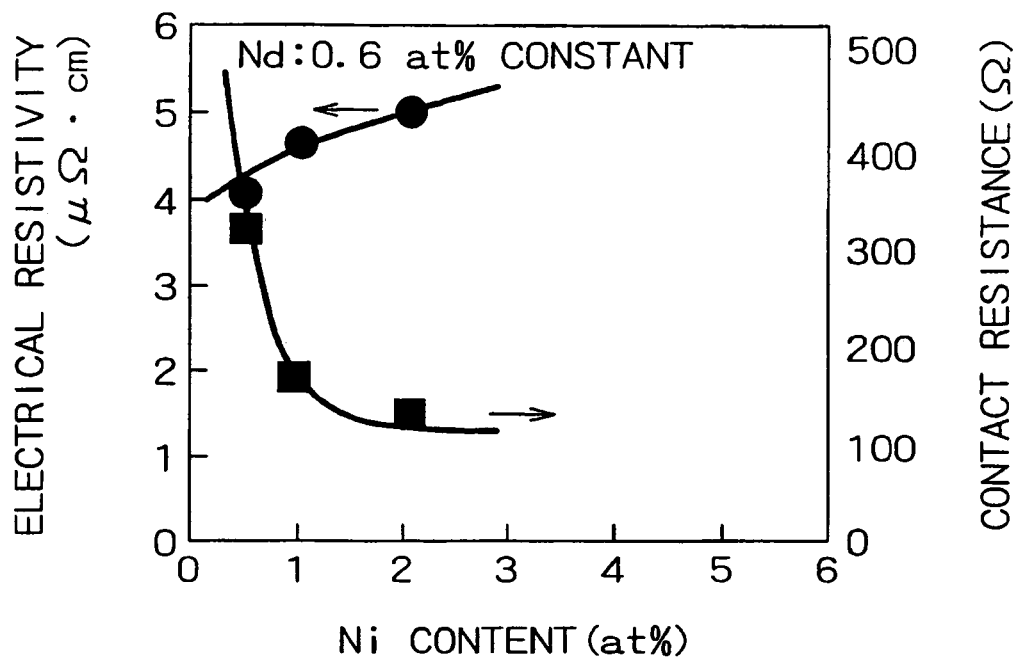
FIG. 24($a$) is a graph showing the influence that X content of Al—X—Nd (X=Ni) has on the electric properties, and similarly FIG. 24($b$) is a graph showing the influence that X content has on the heat resistance.
Figure 24B:
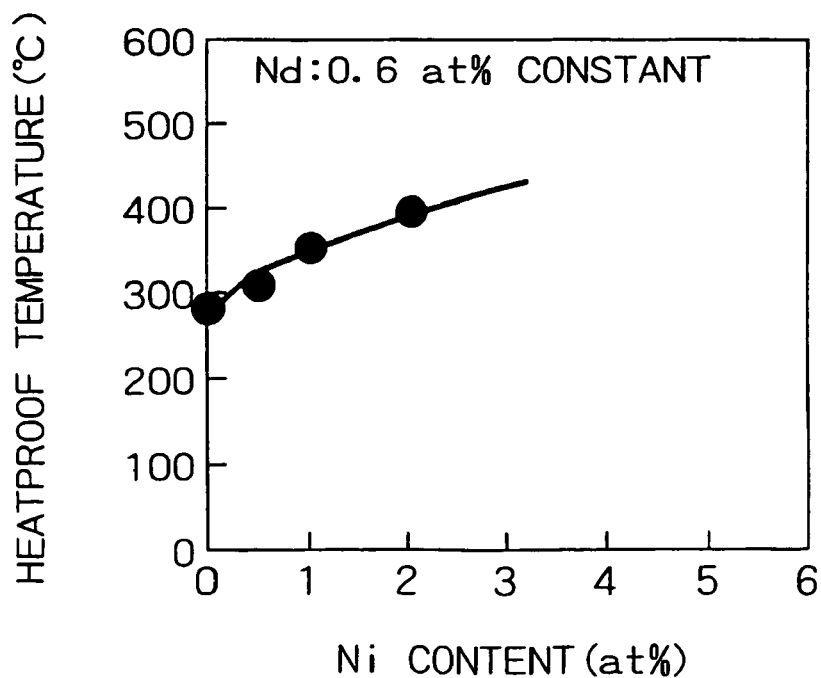
Figure 25A:
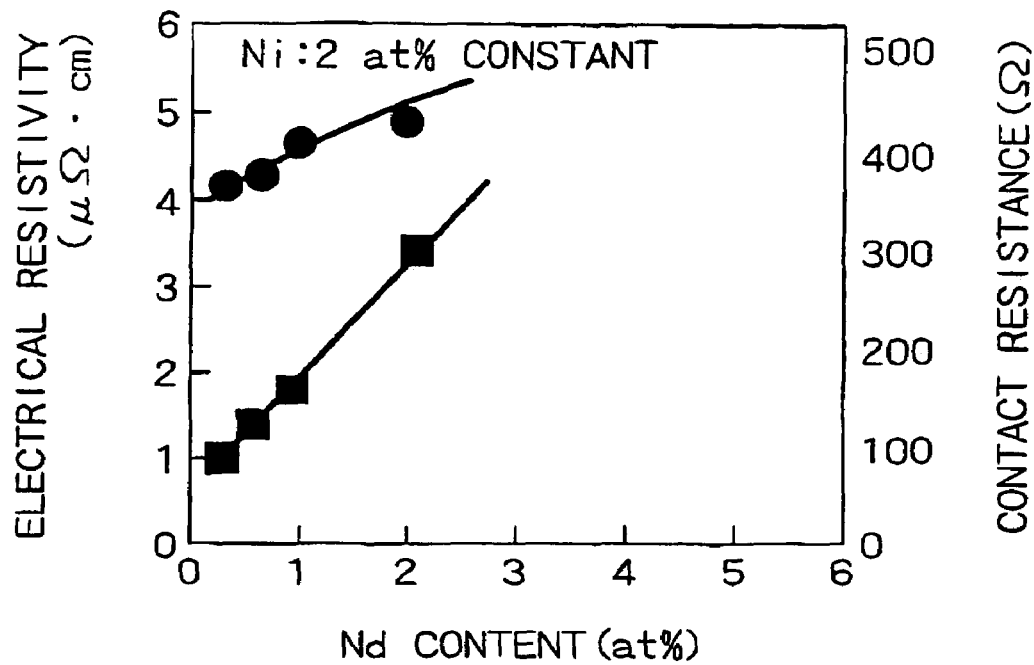
FIG. 25($a$) is a graph showing the influence that Nd content of Al—X—Nd (X=Ni) has on the electric properties, and similarly FIG. 25($b$) is a graph showing the influence that Nd content has on the heat resistance.
Figure 25B:
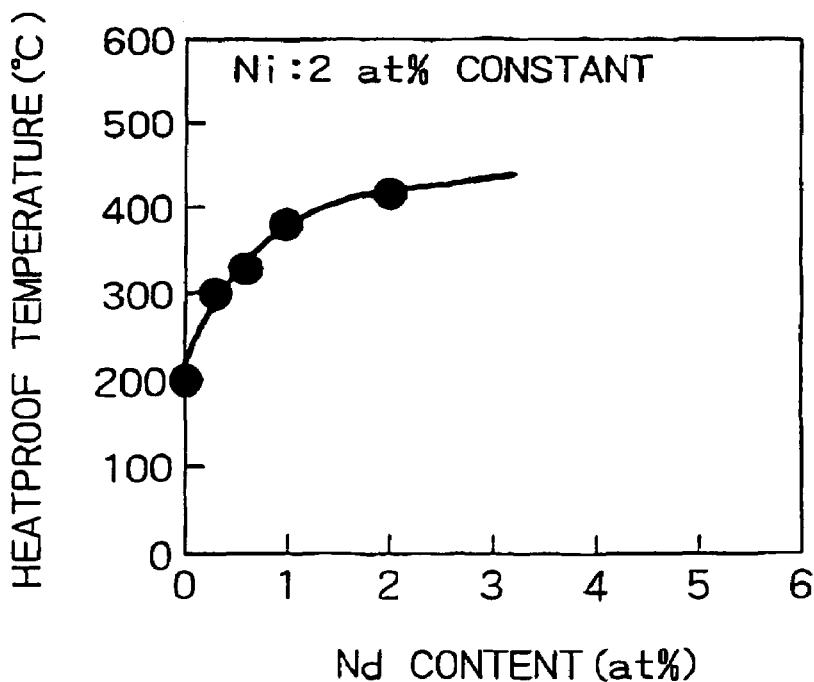

On the other hand, there is correlation between the composition of an aluminum alloy film and each one of the contact resistance, the electrical conductivity, and the heat resistance. For example, if X content of Al—X—Nd (X=Ni) is increased, the contact resistance decreases, but the electric resistance increases, and the heat resistance improves [see FIG. 24(a) and (b)]. Moreover, if Nd content is increased, the heat resistance improves, but the electrical resistivity and the contact resistance increase [see FIG. 25(a) and (b)]. Such a tendency is the same for any element of X. Note that the required contact resistance depends on the structure of a display device and the manufacturer, varying from 150 $\Omega$ to 5 k$\Omega$ in the contact hole of an 80-μm square. Since there are trade-off relations between the electric properties and the heat resistance, one can adjust the composition to respond to specifications required.

Figure 26:
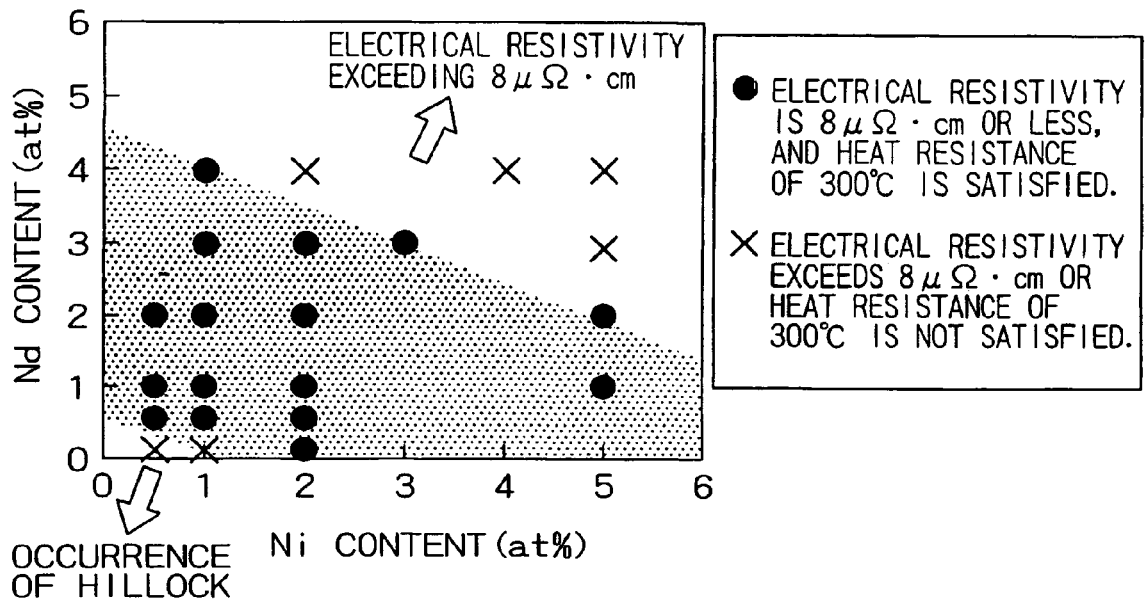
FIG. 26 is a diagram showing the compositional ranges of Ni and Nd of Al—Ni—Nd where an electrical resistivity of 8 $\mu\Omega\cdot$cm and a heat resistance of 300° C. or higher can be secured.

Moreover, in the case of an Al—X—Nd alloy with X=Ni, Ni makes pinning in grain boundary of Al as in the case of Nd, which has an effect of preventing Al from migrating when heat is applied. For example, as shown in FIG. 26, in the region of "$0.5CX_1+CNd \leq 0.7$" [in the formula, $CX_1$ represents Ni content (at %) in the aluminum alloy, and CNd represents Nd content (at %) in the aluminum alloy], a heat treatment at 300° C. resulted in insufficient heat resistance, allowing a hillock to occur. On the other hand, in the region of "$4.5 \leq 0.5\ CX_1+CNd$," the electrical resistivity of the wiring exceeds 8 μΩ·cm, and hence the alloy cannot be put to practical use. From this, the optimal range becomes "$0.7 \leq 0.5CX_1+CNd \leq 4.5$."

Figure 27:
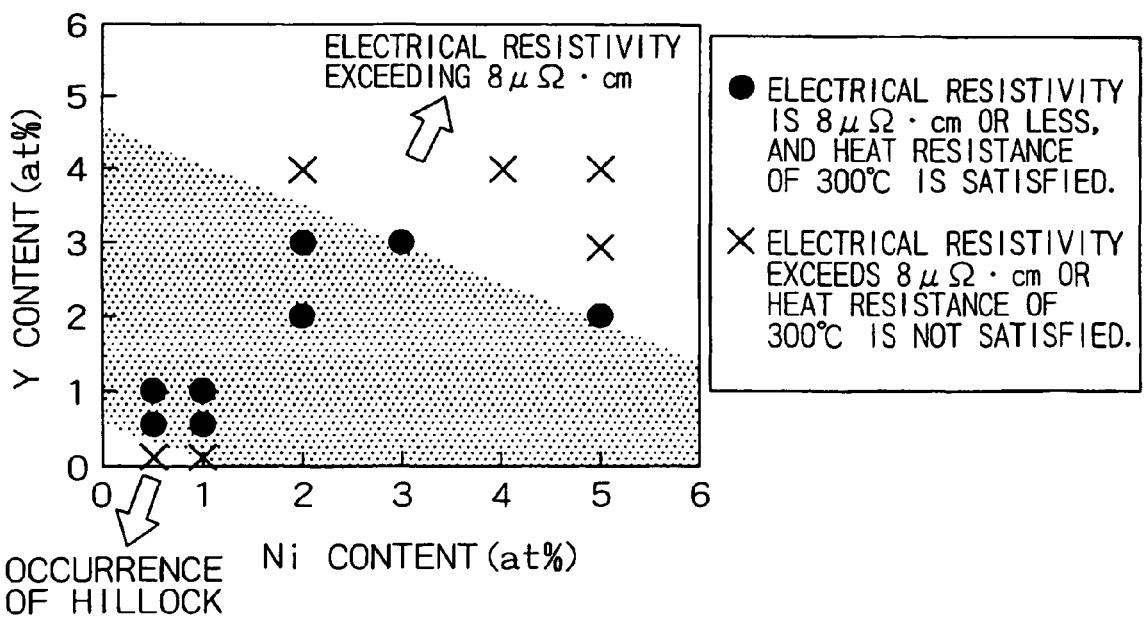
FIG. 27 is a diagram showing the compositional ranges of Ni and Y of Al—Ni—Y where an electrical resistivity of 8 $\mu\Omega\cdot$cm and a heat resistance of 300° C. or higher can be secured.

Similarly, also in the case where the alloy is made to contain yttrium (Y) in the same 3A group, as shown in FIG. 27, the electrical properties and the heat resistance almost the same as those of Nd were obtained.

Figure 28:
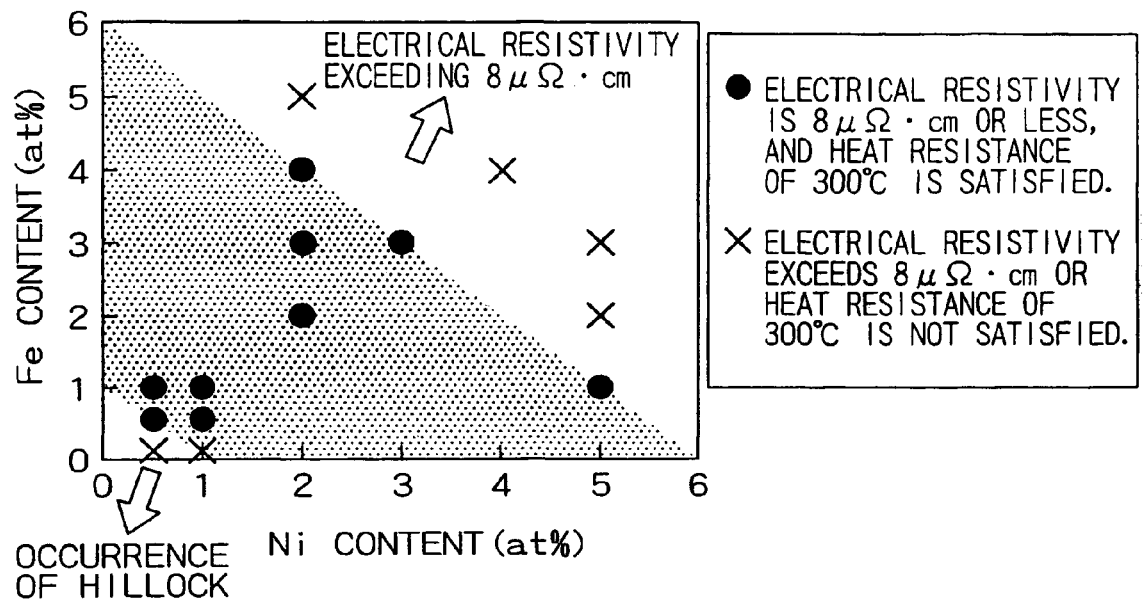
FIG. 28 is a diagram showing the compositional ranges of Ni and Fe of Al—Ni—Fe where an electrical resistivity of 8 $\mu\Omega\cdot$cm and a heat resistance of 300° C. or higher can be secured.

Similarly, for the composition of Al—Ni—Fe, as shown in FIG. 28, in the region of "$CY_1+CY_2 \leq 1$" [in the formula, $CY_1$ represents Ni content (at %) in the aluminum alloy, and $CY_2$ represents Fe content (at %) in the aluminum alloy], a heat treatment at 300° C. resulted in insufficient heat resistance, allowing a hillock to occur. On the other hand, in the region of "$6 \leq CY_1+CY_2$," the electrical resistivity of the wiring exceeds 8 μΩ·cm, and hence the alloy cannot be put to practical use. From this, an optimal range becomes "$1 \leq CY_1+CY_1 \leq 6$."

Figure 29:
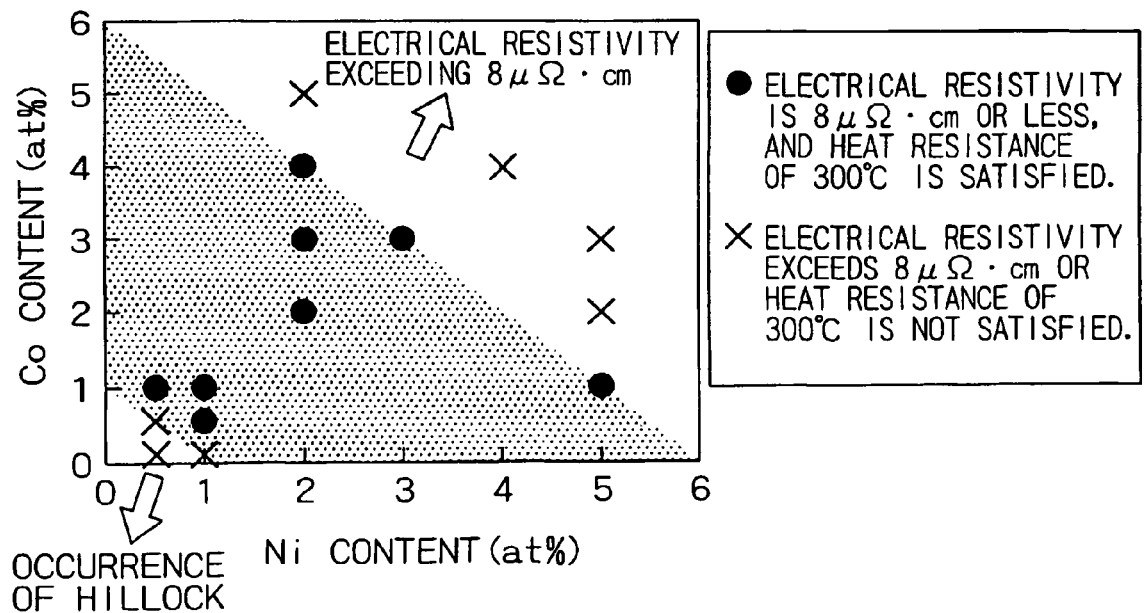
FIG. 29 is a diagram showing the compositional ranges of Ni and Co of Al—Ni—Co where an electrical resistivity of 8 $\mu\Omega\cdot$cm and a heat resistance of 300° C. or higher can be secured.
Figure 30:
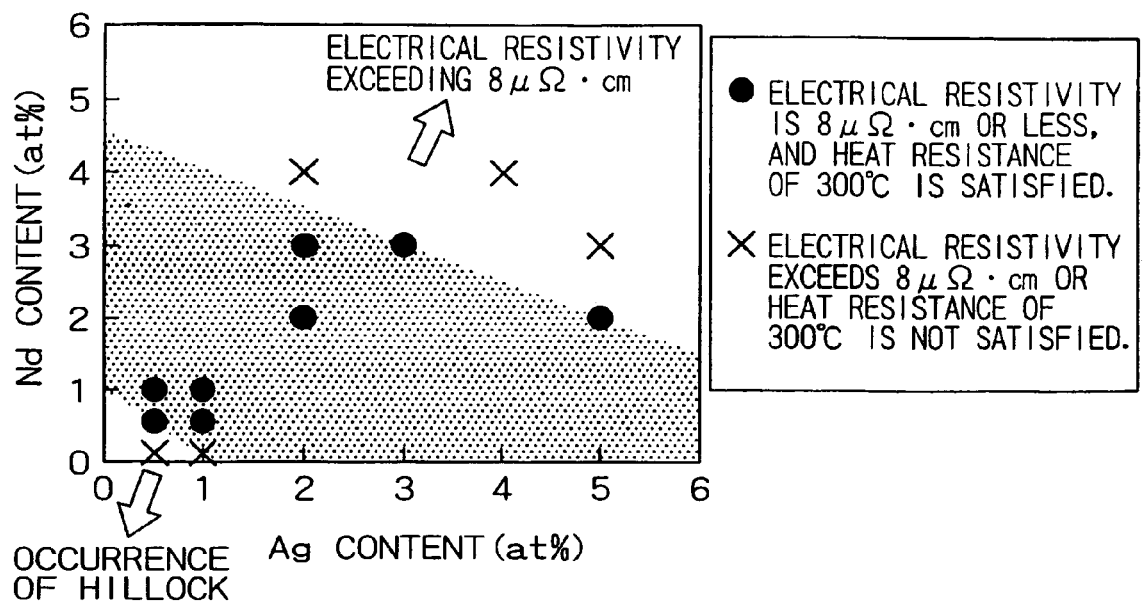
FIG. 30 is a diagram showing the compositional ranges of Ag and Nd of Al—Ag—Nd where an electrical resistivity of 8 $\mu\Omega\cdot$cm and a heat resistance of 300° C. or higher can be secured.
Figure 31:
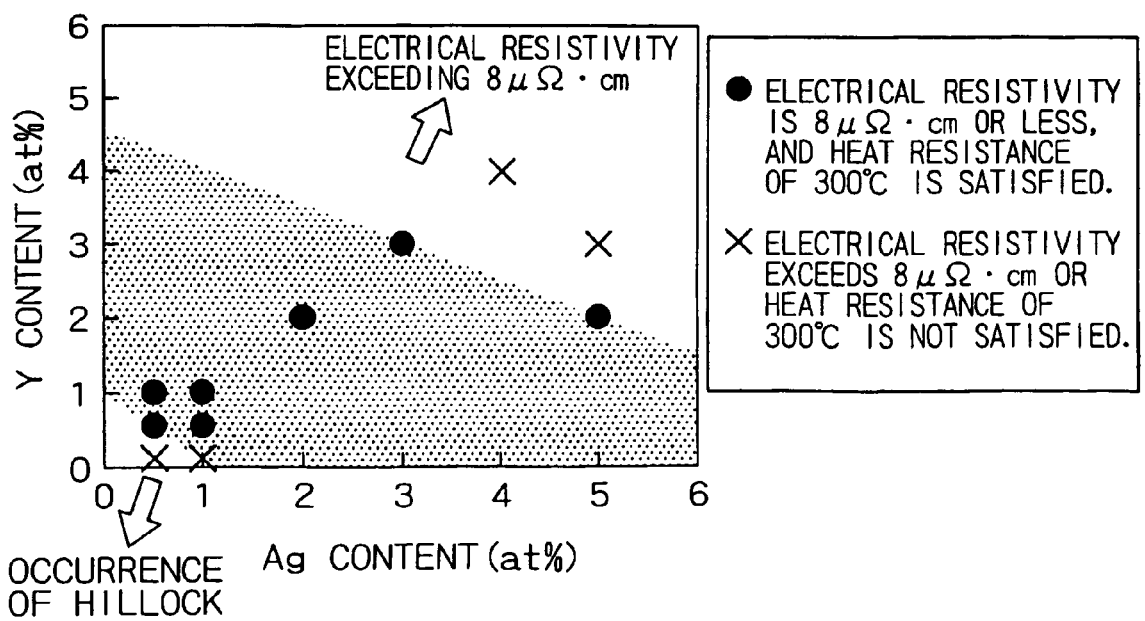
FIG. 31 is a diagram showing the compositional ranges of Ag and Y of Al—Ag—Y where an electrical resistivity of 8 $\mu\Omega\cdot$cm and a heat resistance of 300° C. or higher can be secured.
Figure 32:
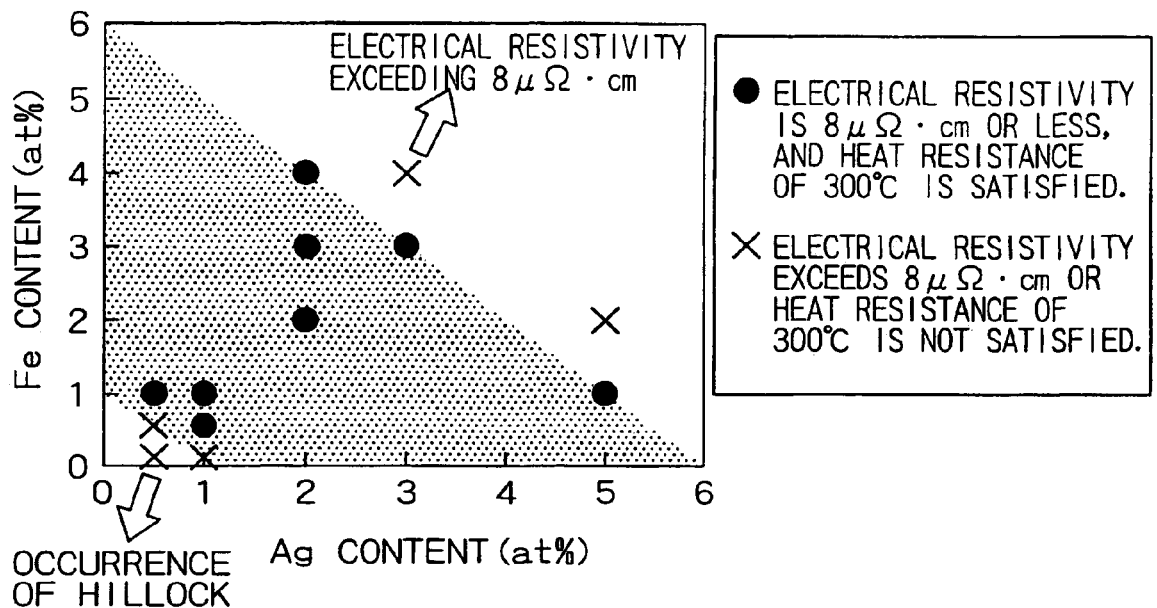
FIG. 32 is a diagram showing the compositional ranges of Ag and Fe of Al—Ag—Fe where an electrical resistivity of 8 $\mu\Omega\cdot$cm and a heat resistance of 300° C. or higher can be secured.
Figure 33:
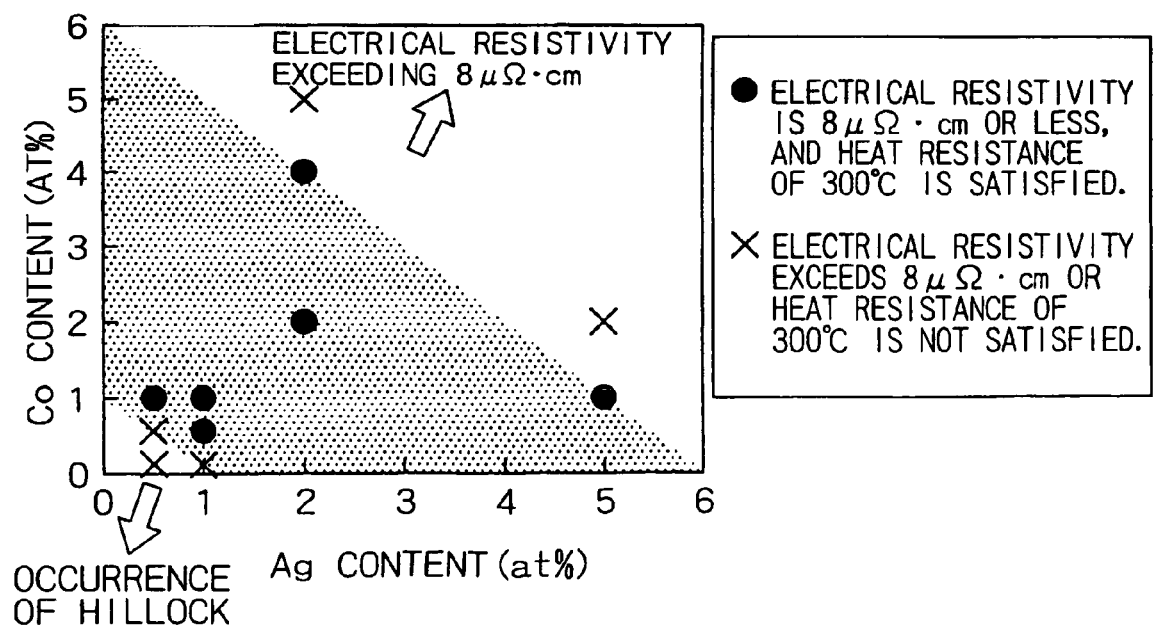
FIG. 33 is a diagram showing the compositional ranges of Ag and Co of Al—Ag—Co where an electrical resistivity of 8 $\mu\Omega\cdot$cm and a heat resistance of 300° C. or higher can be secured.
Figure 34:
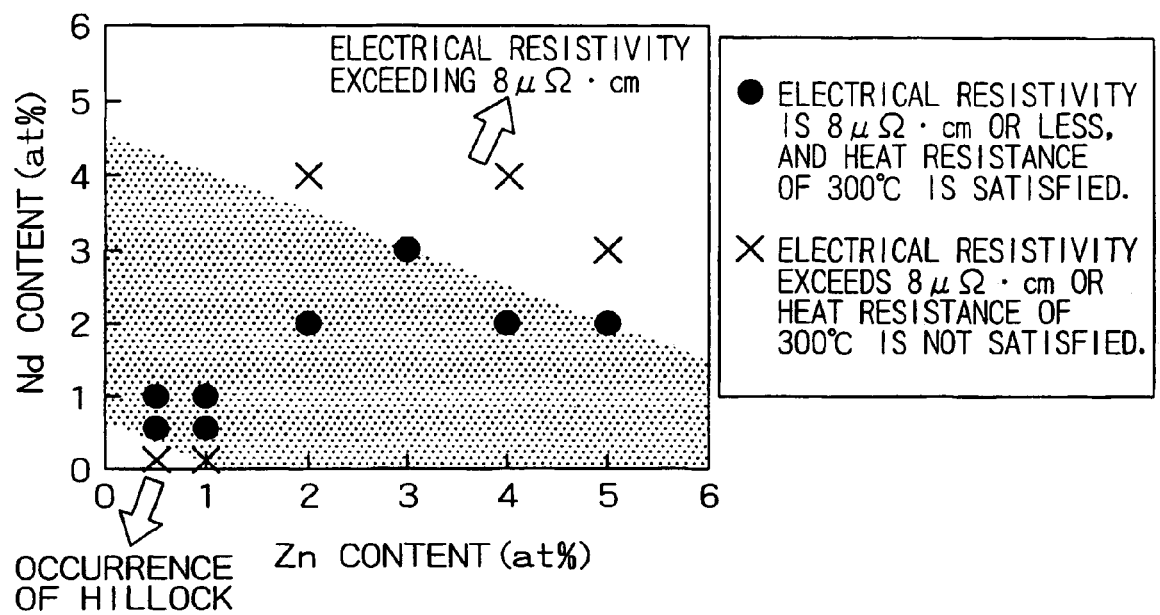
FIG. 34 is a diagram showing the compositional ranges of Zn and Nd of Al—Zn—Nd where an electrical resistivity of 8 $\mu\Omega\cdot$cm and a heat resistance of 300° C. or higher can be secured.
Figure 35:
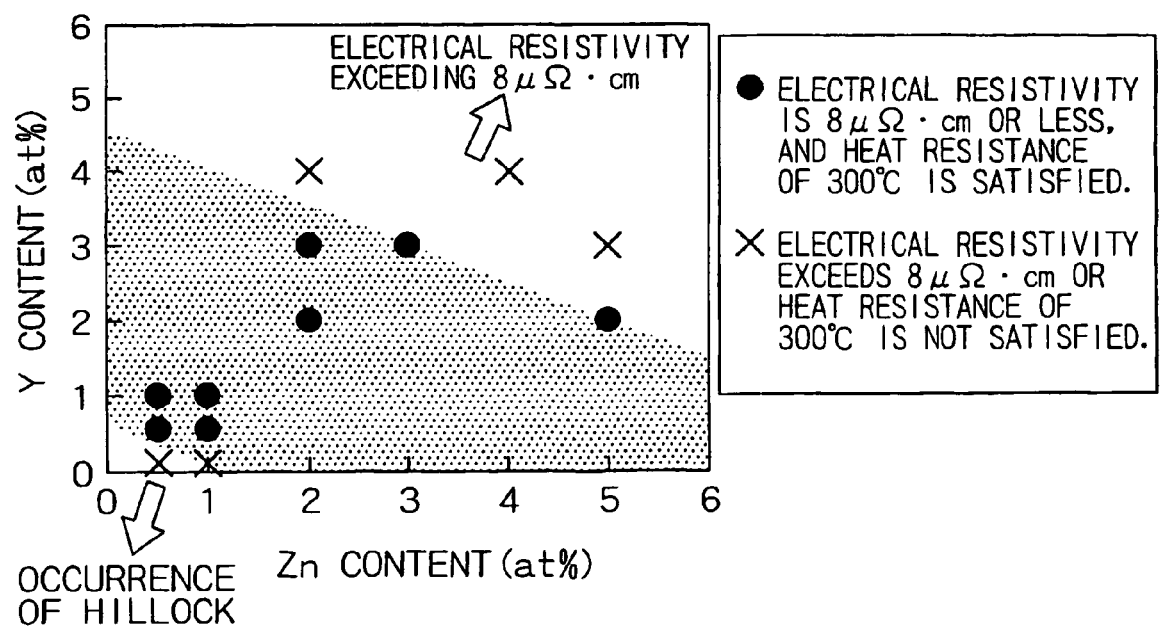
FIG. 35 is a diagram showing the compositional ranges of Zn and Y of Al—Zn—Y where an electrical resistivity of 8 $\mu\Omega\cdot$cm and a heat resistance of 300° C. or higher can be secured.
Figure 36:
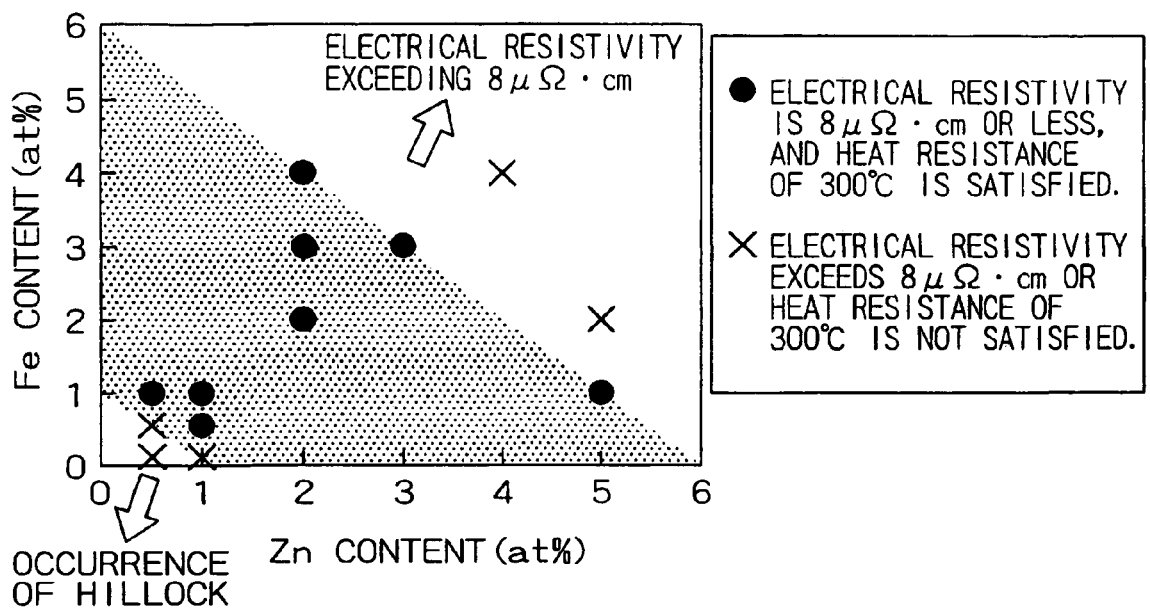
FIG. 36 is a diagram showing the compositional ranges of Zn and Fe of Al—Zn—Fe where an electrical resistivity of 8 $\mu\Omega\cdot$cm and a heat resistance of 300° C. or higher can be secured.
Figure 37:
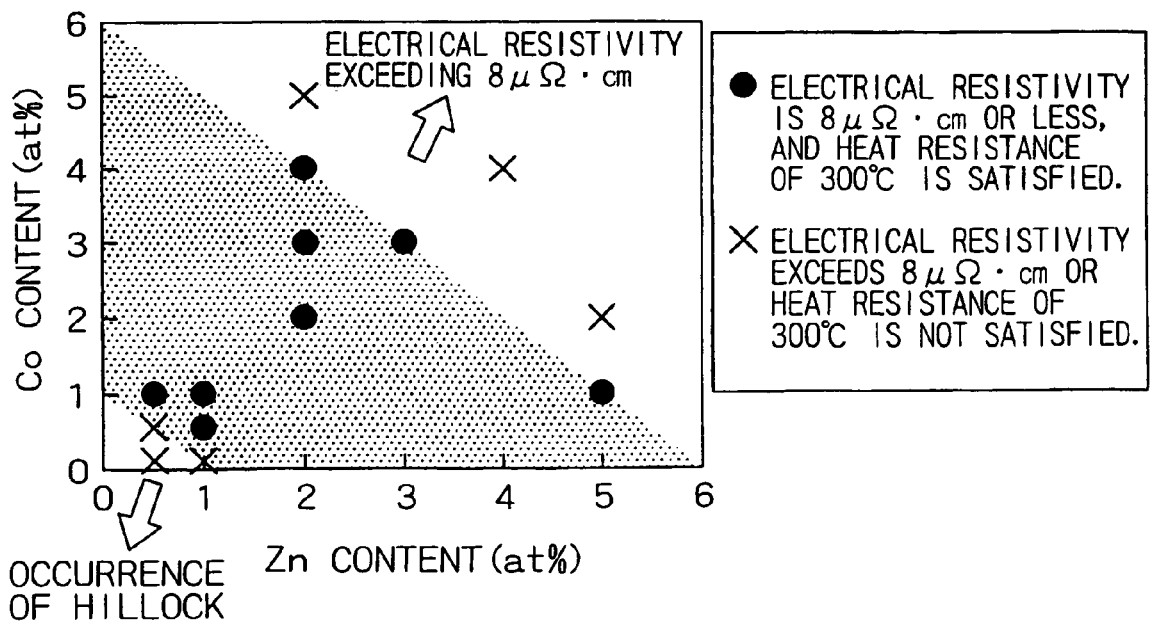
FIG. 37 is a diagram showing the compositional ranges of Zn and Co of Al—Zn—Co where an electrical resistivity of 8 $\mu\Omega\cdot$cm and a heat resistance of 300° C. or higher can be secured.
Figure 38:
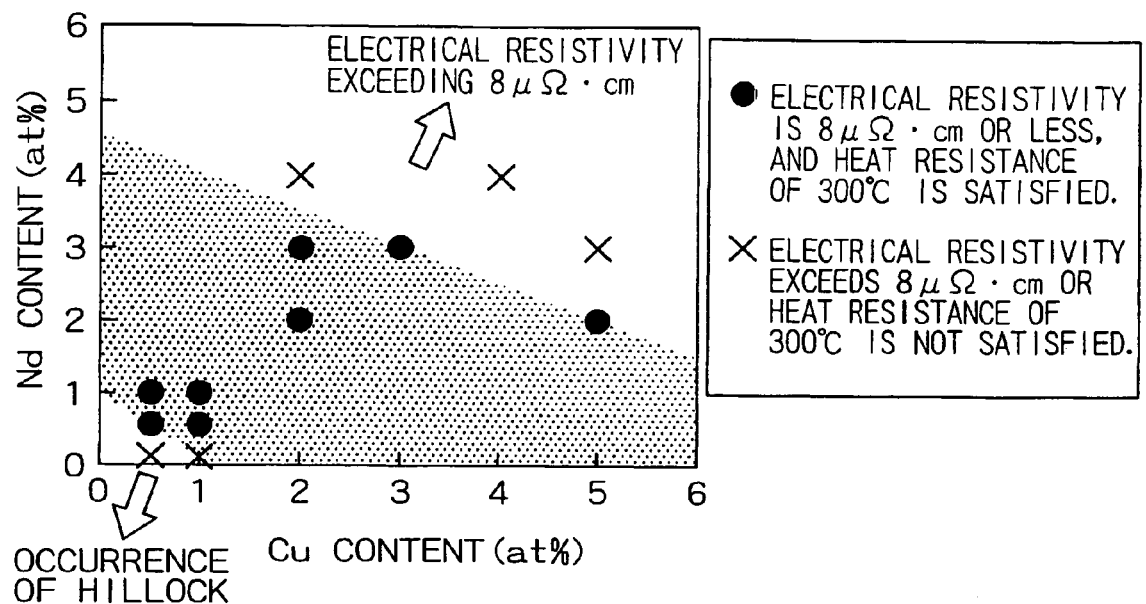
FIG. 38 is a diagram showing the compositional ranges of Cu and Nd of Al—Cu—Nd where an electrical resistivity of 8 $\mu\Omega\cdot$cm and a heat resistance of 300° C. or higher can be secured.
Figure 39:
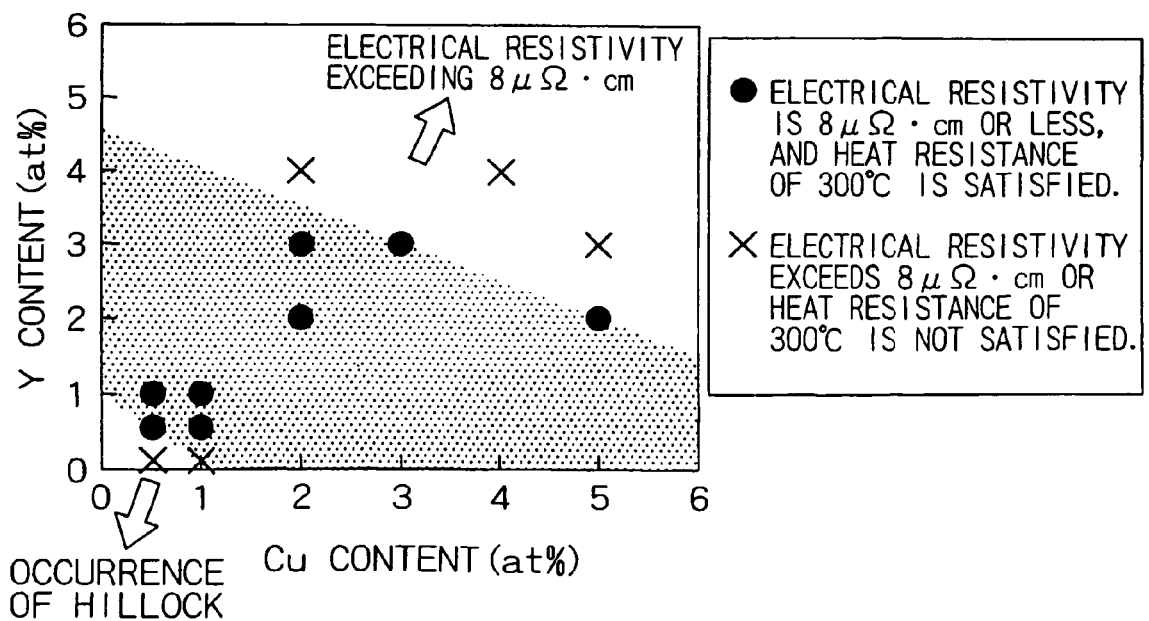
FIG. 39 is a diagram showing the compositional ranges of Cu and Y of Al—Cu—Y where an electrical resistivity of 8 $\mu\Omega\cdot$cm and a heat resistance of 300° C. or higher can be secured.
Figure 40:
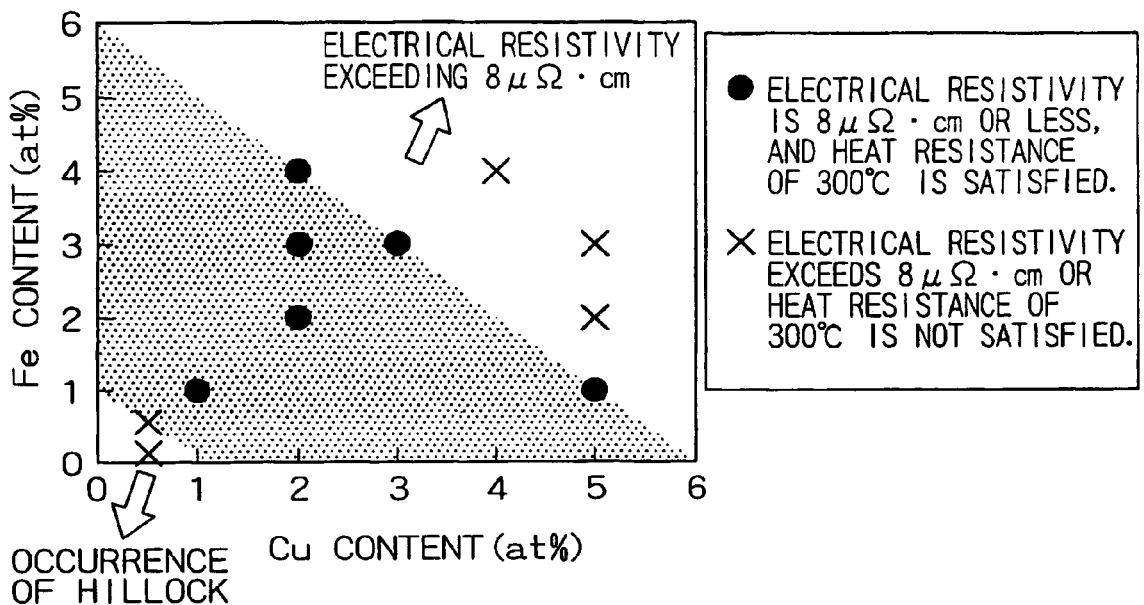
FIG. 40 is a diagram showing the compositional ranges of Cu and Fe of Al—Cu—Fe where an electrical resistivity of 8 μΩ·cm and a heat resistance of 300° C. or higher can be secured.
Figure 41:
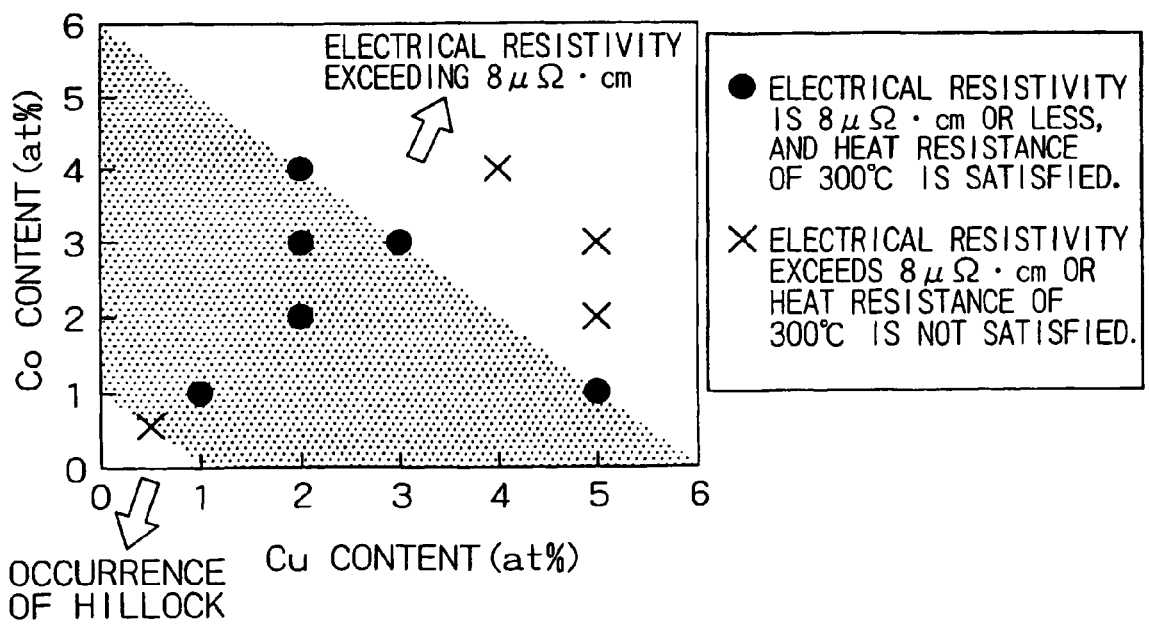
FIG. 41 is a diagram showing the compositional ranges of Cu and Co of Al—Cu—Co where an electrical resistivity of 8 μΩ·cm and a heat resistance of 300° C. or higher can be secured.

Incidentally, it is safely considered that Co and Fe has almost the same effect as transition metals. Also in the case of Al—Ni—Co, as shown in FIG. 29, the same properties as Al—Ni—Fe were obtained. Here, the heat resistance means the highest temperature at which morphology of the aluminum alloy surface will not be deteriorated by generation of hillocks and voids at the time of heat treatment. In the figure, alloys satisfying a condition that the density of the hillock generated when being processed by heat treatment at 300° C. was not more than $3 \times 10^8$ m$^{-2}$ were considered to come up to the standard.

Similarly, the cases of Al—X—Nd, —Y, —Fe, and —Co alloys with X=Ag were shown in FIGS. 30, 31, 32, and 33, and the cases of Al—X—Nd, —Y, —Fe, and —Co alloys with X=Zn were shown in FIGS. 34, 35, 36, and 37. Furthermore, the cases of Al—X—Nd, —Y, —Fe, and —Co alloys with X=Cu were shown in FIGS. 38, 39, 40, and 41. In the cases where any one of alloy elements was added, almost the same results were obtained.

In a lower heat treatment temperature, the aforementioned optimal range shifts. The heat treatment temperature depends on a temperature in a process after formation of an aluminum alloy film. The heat treatment temperature in the present embodiment is a temperature in which an insulation film is formed. An aluminum alloy film recrystallizes when it is heated. When heat is further applied after complete relief of the stress in the film by increasing the temperature of the heat treatment, grains in aluminum extraordinarily grow to cause a hillock. The upper and lower limits of the heat treatment temperature satisfying heat resistance shift depending on the composition of the alloy. In other words, the upper and lower limits of the optimal range shift depending on the heat treatment temperature. For example, in the elements regarding above mentioned CX1 and CX2, since 150° C. of the heat treatment temperature does not proceed with the recrystallization, the lower limit of the optimal range shifts down to 0.2. Similarly, in the elements regarding above mentioned CY1 and CY2, the lower limit of the optimal range shifts down to 0.4.

In this invention, assume that electrical conduction in the pixel electrode and the aluminum alloy film is intended to be established through the precipitate of the solute element. In other words, assume that, in each aluminum alloy, easy-to-oxidize aluminum makes contact with the pixel electrode in the interface between the pixel electrode and the aluminum alloy except an area where the solute element is precipitated, and high resistance aluminum oxide exists on the surface thereof. In this case, it is considered that the electrical resistivity depends on the electrical resistivity of the low-resistance precipitate of a solute element. If electrical conduction is established only by a precipitate only of the solute element, the surface area and the density of the precipitate necessary to satisfy a desired contact resistance can be prescribed by calculation.

Now, assume that contact resistance required when the contact size is an 80-μm square is 200 Ω or less. In the case where a solute element is zinc, the electrical resistivity of zinc is 5.92 μΩ·cm, and 3287 particles or more of the precipitate are required assuming that a single precipitate of zinc 0.03 μm in major diameter will precipitate out two-dimensionally in the interface between the pixel electrode and the aluminum alloy. That is, 51.4 particles/100 μm$^2$ or more is required in terms of density. Moreover, in the case where a solute element is silver, the electrical resistivity of silver is 1.5 μΩ·cm, and 833 particles or more of the precipitate are required assuming that a single precipitate of silver 0.03 μm in major diameter will precipitate out two-dimensionally in the interface between the pixel electrode and the aluminum alloy. That is, 12.9 particles/100 μm$^2$ or more is required in terms of density.

Note that, if the major diameter of the precipitate is assumed to be 0.3 μm, the same as the measured value; in the case of Al—Ag, 8.3 particles or more are required for an 80-μm square, and in the case of Al—Zn, 32.9 particles or more are required for the same area, as shown in FIG. 7. That is, the density needs to be 0.13 particle/100 μm$^2$, and 0.51 particle/100 μm$^2$, respectively.

On the other hand, in the case of Al—Ni, the major diameter of the structure is 0.05 μm. In this case, assuming that the electrical resistivity of Ni is 6.84 μΩ·cm and the electrical resistivity of the precipitate is almost the same as this, calculation shows that roughly 1345 particles/80-μm square is required in the case of a major diameter of 0.05 μm. That is, the density needs to be 21 particles/100 μm$^2$.

If one element selected from the group consisting of Nd, Y, Fe, and Co is added to this Ni-containing aluminum alloy, the structure will become fine. For example, in the case of Al—Ni—Y, the major diameter of the structure will become 0.01 to 0.03 μm. In this case, assuming that the electrical resistivity of Ni is almost the same as the electrical resistivity, calculation shows that roughly 3740 particles/80-μm square is required in the case of a major diameter of 0.03 μm. That is, the density needs to be 58 particles/100 μm$^2$. Moreover, if all the particles are assumed to be 0.01 μm in major diameter, the above figure will become 526 particles/100 μm$^2$.

Alternatively, in the case of Al—Ni—Nd, the major diameter of the structure becomes 0.02 to 0.04 μm. In this case, calculation shows that roughly 2104 particles/80-μm square is required in the case of a major diameter of 0.04 μm. That is, the density must be 33 particles/100 μm$^2$. Moreover, if all the particles are assumed 0.02 μm in major diameter, the above figure will become 132 particles/100 μm$^2$.

TABLE 7

Size and density of main precipitate in aluminum alloys

| | Major diameter of main precipitate (µm) | Number of precipitate particles (per 100 µm$^2$) |
|---|---|---|
| Al—Ag | 0.3 | 0.13 |
| Al—Zn | 0.3 | 0.51 |
| Al—Ni | 0.05 | 21 |
| Al—Ni—Nd | 0.02 | 132 |
| Al—Ni—Y | 0.01 | 526 |

Summarizing the foregoing, in the case where Ag whose electrical resistivity, as a single substance, is the lowest is used, the precipitate particles all assumed to be 0.3 µm in major diameter are required to exist with a density of 0.13 particle/100 µm$^2$ or more in order to satisfy the required contact resistance of 200 Ω. Moreover, in the case where Al—Ni—Y whose precipitate is the smallest is used, the precipitate particles all assumed to be 0.01 µm in major diameter are required to exist with a density of 526 particles/100 µm$^2$ or more. In addition, similarly in the case where Al—Ag alloy is used and the precipitate particles each have a major diameter of 0.01 µm, the required density of the precipitate particles becomes 115 particles/100 µm$^2$.

Note that, the value is obtained assuming that the electrical resistivity of the precipitate is equal to that of a simple substance of the added element. There is a case where the electrical resistivity of a precipitate containing the element concerned and aluminum may vary largely from that of the simple substance of the element. In that case, there is the possibility that the area factor calculated from the size and number of the precipitate particles may differ from the area factor derived by TEM observation of the actual contact plane. This is considered because the number of the precipitate particles is increased according to a ratio of the electrical resistivity of the precipitate and that of the simple substance of the added element in realizing a contact resistance of 200 Ω.

Note that, in reality, in the case of an alloy system that will form a precipitate (an intermetallic compound), it is considered that it will exist in the form of a precipitate compound with large ones and small ones all mixed together, but calculation results of the contact resistance when zinc was used and when silver was used were almost of the same order as experimental results.

Thus, in the case where the aluminum alloy according to this invention is used, the contact resistance become approximately $\frac{1}{10}^4$ as compared to the case where pure aluminum wiring is brought into direct contact with the ITO film.

Note that, if the substrate temperature at the time of sputtering of the transparent electrode is raised, the contact resistance will fall. For example, in the case of ITO, the contact resistance will be reduced by half if the substrate temperature becomes 50° C. or higher. Furthermore, preferably, if crystallinity of ITO is improved by substrate heating of 100° C. or higher, the contact resistance will be reduced to approximately ⅕ or so.

Even when deposition of ITO is performed with the substrate temperature being set to room temperature, if the film is processed by heat treatment at 150° C. or higher for about 30 minutes after deposition and is transformed into polycrystal, the contact resistance will be reduced by half. Since polycrystalline ITO is hard to etch, normally it is often the case that ITO is deposited at room temperature, patterned, and etched, and subsequently is processed by heat treatment to be made polycrystalline, whereby the electrical resistivity of ITO is reduced, attaining low resistance.

From the above, in order to reduce the contact resistance, it is desirable that the substrate temperature at the time of deposition of the transparent electrode is raided to 50° C. or higher, more preferably 100° C. or higher, and that even when the deposition is performed at room temperature, the transparent electrode is processed by heat treatment at 150° C. or higher for 30 minutes or more after deposition of the transparent electrode. Incidentally, even when the transparent electrode is IZO, there is the same effect, but crystallization of IZO does not progress in a temperature region of this level, the contact resistance will fall slightly.

As described above, when the liquid crystal display device was made as an experiment with the embodiment of this invention, both the device was exactly equivalent to a case where the ITO film and the barrier metal are combined in terms of manufacture yield and display quality. Therefore, this liquid crystal display device makes it possible to attain performance comparable to the conventional liquid crystal display device without disposing the barrier metal.

Therefore, the barrier metal can be eliminated and the manufacturing process can be simplified, and hence the manufacturing cost can be reduced considerably.

That is, by using the aluminum alloy containing such a specific element as described above as an electrode material instead of conventional pure aluminum, aluminum or Mo—W film, direct contact with the pixel electrode becomes possible, the manufacturing process is simplified, and considerable reduction in the manufacturing cost becomes possible.

In the same manner as the experimental method of the Table 1, silicon nitride (SiN$_x$) is deposited on Al-2 at % Ag alloy (thickness: 300 nm) and subsequently is processed by heat treatment at 300° C. for 1 hour, and a contact hole of an 80-µm square is patterned by photolithography, and subsequently dry etching was performed using fluorine system plasma. At this time, by adjusting a time of over-etching that follows the etching of the silicon nitride (SiN$_x$) film, the etching depth of the aluminum alloy was made to vary. Then, ashing and washing with the "stripper 106" were performed, and the ITO film was deposited. The etching depth of the aluminum alloy surface was measured by section observation with a scanning electron microscope and a transmission electron microscope.

Figure 23:
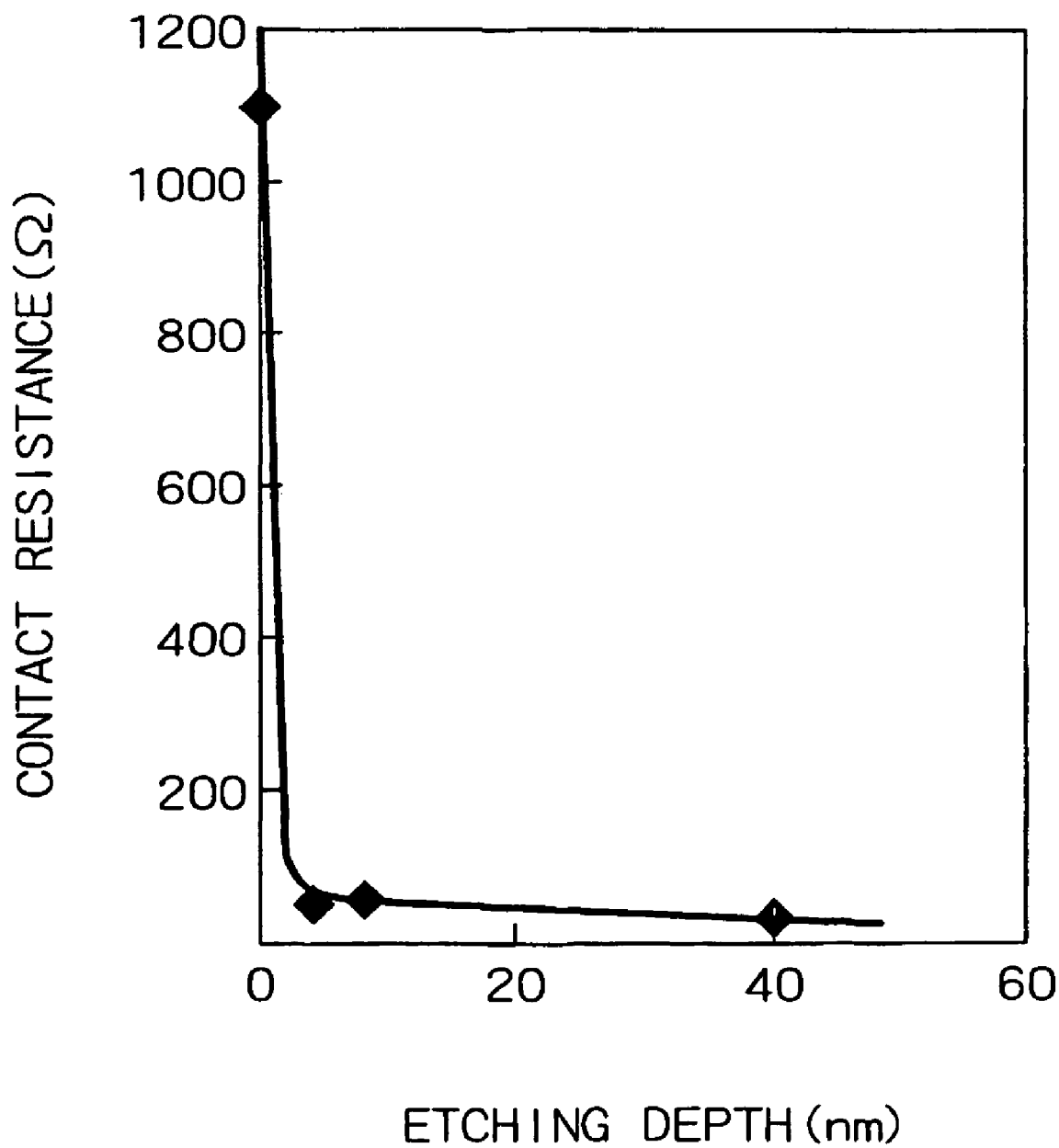
FIG. 23 is a graph showing a relationship between the etching depth of the aluminum alloy surface and the contact resistance obtained in the experiment.

FIG. 23 shows a relationship between the etching depth of the aluminum alloy surface and the contact resistance. As is clear also from this figure, it can be understood that if the aluminum alloy surface was etched only a little, the contact resistance decreases rapidly. It is considered that a precipitate of the solute element exposed by etching makes it possible to form electric connection with the pixel electrode.

It was confirmed experimentally that even with an etching depth of about 5 nm from the aluminum alloy surface, a contact resistance of approximately 56 Ω could be obtained. It is considered that etching depth necessary to establish contact of such a low resistance depends on the size and distribution of structures of the precipitate or, the thickness of a surface oxide layer of the aluminum alloy, etc. According to the Auger electron spectroscopy, it was confirmed that the precipitate whose principal component was Ag was exposed on the aluminum alloy surface. Moreover, insulating material layers, such as oxide layers, did not exist on the surface of the precipitate.

The observed specimen is of a state where the aluminum alloy surface was already etched by 5 nm, and it is considered that, if precipitate is exposed on the aluminum alloy surface, the aluminum alloy, as it is, can make electric connection with the pixel electrode, but at least a contamination layer of the surface needs to be etched. Moreover, since the thickness of the oxide layer of the aluminum alloy surface that was oxidized is approximately 3 to 5 nm or so, an etching depth of at least about 3 nm or more is required in order to remove the oxide layer and expose the aluminum alloy surface in such a case.

On the other hand, if the etching depth is too deep and the film thickness as wiring becomes thin, there arises a problem of increase in electric resistance or decrease in reliability. For example, the film thickness of the source and drain electrode used in this embodiment is 300 nm, and so it is judged that the etching depth for securing direct contact between the aluminum alloy and the pixel electrode is preferably in a range of 1 to 200 nm, more preferably 3 to 100 nm.

It is desirable to lessen impurities contained in the aluminum alloy wiring material as much as possible. For example, oxygen and carbon make the film become cloudy, or increase the electrical resistivity of the wiring. For this reason, if the electrical resistivity is intended to be reduced to 5 $\mu\Omega\cdot cm$ or less, concentrations of these impurities contained in the wiring material should be controlled to the following values as of a quantitative value determined by compositional analysis through XPS analysis: the oxygen content of not more than 7 at %; and the carbon content of not more than 0.4 at %, more preferably not more than 0.2 at %.

For example, in the case where the impurity is carbon, carbon compounds, such as $Al_4C_3$ and NiC, with stoichiometric compositions are ceramics and originally have electric insulation, and so the electrical conductivity of the wiring itself is considered to increase, although depending on the addition. Moreover, a precipitate that emerges in Al grain boundary by heat treatment becomes a precipitate containing the carbon compound. It is considered that, if a current path between ITO and the wiring material is one that goes through the precipitate, the contact resistance becomes high as compared to precipitates not containing carbon. Therefore, the aluminum alloy wiring material not containing carbon is preferable in terms of contact resistance with ITO.

There arises a problem that in depositing wiring material containing carbon by sputtering, carbon compounds of aluminum carbide compound etc. adhere to the inside of a chamber of sputtering equipment, causing contamination, and consequently frequent maintenance of the equipment becomes necessary. In the case where impurity is oxygen, a problem arises similarly, that is, conductive alumina ($Al_2O_3$) is generated, and the electrical resistivity of the wiring increases. In order to prevent such things, it is desirable to prevent mixing of contaminations in the manufacturing process, for example, taking a measure of creating a high vacuum with a degree of vacuum attained of $5 \times 10^{-6}$ or higher in the equipment at the time of sputtering.

What is claimed is:

1. A method of manufacture of an electronic device having a first electrode including a metal oxide and a second electrode including an aluminum alloy film, said second electrode being directly contacted and electrically connected to said first electrode and, in a contact interface between said aluminum alloy film and said first electrode, at least a part of alloy components constituting said aluminum alloy film exist as a precipitate, the method comprising:
    forming said precipitate that contains said at least a part of the alloy components constituting said aluminum alloy film by heating said aluminum alloy film formed on a substrate at a temperature of 150 to 400° C.

2. The method of manufacture according to claim 1, wherein said aluminum alloy film is formed by a sputtering method.

3. A method of manufacture of an electronic device having a first electrode including a metal oxide and a second electrode including an aluminum alloy film, said second electrode being directly contacted and electrically connected to said first electrode and, in a contact interface between said aluminum alloy film and said first electrode, at least a part of alloy components constituting said aluminum alloy film exist as a precipitate, the method comprising:
    forming said aluminum alloy film on a substrate;
    forming an insulating film on said aluminum alloy film;
    processing the insulating film by hole etching; and
    etching said aluminum alloy film by 1 to 200 nm from the surface thereof successively after the hole etching, whereby a precipitate containing at least a part of the alloy components contained in said aluminum alloy film is exposed partially.

4. The method of manufacture according to claim 3, wherein the etching is performed by dry etching using a gas capable of etching said aluminum alloy film.

5. The method of manufacture according to claim 3, wherein the etching is performed by wet etching using a chemical capable of etching said aluminum alloy film.

6. The method of manufacture according to claim 3, wherein a photoresist stripper including not less than 5 wt % amine compound is used in cleaning of the aluminum alloy film after the etching.

7. The method of manufacture according to claim 3, wherein said metal oxide comprises either indium tin oxide or indium zinc oxide.

* * * * *